(12) United States Patent
Nakazawa et al.

(10) Patent No.: US 6,657,829 B2
(45) Date of Patent: Dec. 2, 2003

(54) TUNNELING MAGNETORESISTIVE DEVICE

(75) Inventors: Makoto Nakazawa, Niigata-ken (JP); Takashi hatanai, Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 101 days.

(21) Appl. No.: 09/773,843

(22) Filed: Jan. 31, 2001

(65) Prior Publication Data

US 2002/0163764 A1 Nov. 7, 2002

(30) Foreign Application Priority Data

Feb. 4, 2000 (JP) .................................... 2000-027554

(51) Int. Cl.⁷ ................................................ G11B 5/39
(52) U.S. Cl. ................................................. 360/324.2
(58) Field of Search .......................... 360/324.2, 324.1, 360/324, 313, 110

(56) References Cited

U.S. PATENT DOCUMENTS

| | | | |
|---|---|---|---|
| 5,390,061 A | 2/1995 | Nakatani et al. | 360/324.2 |
| 5,747,859 A | 5/1998 | Mizushima et al. | 257/421 |
| 5,835,314 A | 11/1998 | Moodera et al. | 360/324.2 |
| 5,898,548 A | 4/1999 | Dill et al. | 360/324.2 |
| 6,023,395 A | 2/2000 | Dill et al. | 360/324.2 |
| 6,069,820 A | 5/2000 | Inomata et al. | 365/171 |
| 6,411,478 B1 * | 6/2002 | Mao et al. | 360/324.2 |

FOREIGN PATENT DOCUMENTS

| | | |
|---|---|---|
| EP | 1 017 2117 | 6/1998 |
| EP | 0 953 849 | 11/1999 |
| JP | 11-274597 | 10/1999 |
| WO | 99 22368 | 5/1999 |

\* cited by examiner

Primary Examiner—Julie Anne Watko
(74) Attorney, Agent, or Firm—Brinks Hofer Gilson & Lione

(57) ABSTRACT

A tunneling magnetoresistive device comprises an insulating barrier layer, and at least two ferromagnetic layers provided on the same plane of the layer. The insulating barrier layer can be initially formed, so that when a metal layer is oxidized to form the insulating barrier layer, it is unnecessary to pay care to the influence of oxidation on the ferromagnetic layers. The insulating barrier layer can be formed in large thickness, thereby suppressing defects, such as pinholes, from occurring. Thus, a tunneling magnetoresistive device having good characteristics can be manufactured.

25 Claims, 7 Drawing Sheets

FACE OPPOSITE TO RECORDING MEDIUM

FACE OPPOSITE TO
RECORDING MEDIUM

FACE OPPOSITE TO
RECORDING MEDIUM

TUNNELING MAGNETORESISTIVE DEVICE

BACKGROUND OF THE INVENTION

1. Field of the Invention

This invention relates to a tunneling magnetoresistive device mounted, for example, in magnetic reproduction apparatus such as hard disks or other magnetic detector devices. More particularly, the invention relates to a tunneling magnetoresistive device that is able to obtain a stable resistance variation rate and also to a method for manufacturing the same.

2. Description of the Related Art

It is known that a GMR (giant magnetoresistive) device exhibiting a giant magnetoresistive effect is used as a read-only head mounted such as in a hard disk device, and such a GMR device has high sensitivity.

Among GMR devices, there is known a spin valve film that is relatively simple in structure and is able to change in resistance by application of a weak external magnetic field. This spin valve film most simply has a four-layered structure.

FIG. 15 is a partial schematic view showing the structure of a spin valve film. FIG. 15 is a front view as seen from a side opposite to a recording medium.

Reference numerals 1 and 3 indicated in FIG. 15 are, respectively, ferromagnetic layers formed of an NiFe alloy, and a non-magnetic conductive layer 2 formed of Cu or the like is interposed between the ferromagnetic layers.

With this type of spin valve film, the ferromagnetic layer 1 is a layer called a free magnetic layer, and the ferromagnetic layer 3 is a fixed magnetic layer. Hereinafter, the ferromagnetic layer 1 is called free magnetic layer, and the ferromagnetic layer 3 is called fixed magnetic layer.

As shown in FIG. 15, an antiferromagnetic layer 4 formed of NiMn alloy is formed in contact with the fixed magnetic layer 3, and when annealed in a magnetic field, an exchange anisotropic magnetic field takes place between the fixed magnetic layer 3 and the anti-ferromagnetic layer 4, thereby causing the magnetization to be fixed along a height thereof (in a direction of Y in the figure).

On the other hand, the free magnetic layer 1 is influenced by a bias layer (not shown), so that its magnetization is uniformly arranged in a direction of track width (in a direction of X in the figure), thereby permitting the magnetization to be in the crossing relation between the fixed magnetic layer 3 and the free magnetic layer 1.

As shown in FIG. 15, electrode layers 5, 5 are provided at opposite sides along the direction of track width (in a direction of X in the figure) of the laminated film covering from the free magnetic layer 1 to the anti-ferromagnetic layer 4, respectively. It will be noted that the conductive layers 5, 5 are each formed of Cu (copper), W (tungsten), Cr (chromium) or the like.

With the spin valve film shown in FIG. 15, when the direction of magnetization of the free magnetic layer 1 varies by the influence of a leakage magnetic field from a recording medium such as of a hard disk, the electric resistance varies by the relation with respect to the fixed magnetization direction of the fixed magnetic layer 3, the leakage magnetic current from the recording medium can be detected according to the variation in voltage based on the change of electric resistance. The resistance variation rate (MR ratio) of the spin valve film ranges from approximately several to tens and several of percent.

The recent tendency toward high recording density results in the increasing areal density of a hard disk device. With a GMR device that is now in the main current, there arises a problem as to whether or not a further higher recording density (particularly, of 40 Gbits/inch$^2$ or over) is enabled.

As a reproduction head substituted for the GMR device, attention has now been drawn to a tunneling magnetoresistive device. The resistance variation rate (i.e. a TMR ratio) of the tunneling resistive effect device arrives at several tens of percent, so that a very high reproduction output can be obtained in comparison with the GMR device.

FIG. 16 is a schematic view showing part of a structure of a conventional tunneling magnetoresistive device. FIG. 16 is a front view as seen from a side opposite to a recording medium.

Reference numerals 1 and 3 indicated in FIG. 16 are, respectively, a free magnetic layer and a fixed magnetic layer, like the spin valve film shown in FIG. 15, and an anti-ferromagnetic layer 4 is formed on and in contact with the fixed magnetic layer 3.

The differences in structure from the spin valve film reside in that an insulating barrier layer 6 made, for example, of $Al_2O_3$ (alumina) is formed between the free magnetic layer 1 and the fixed magnetic layer 3 and that the electrodes 5, 5 are provided on opposite sides in a direction vertical (in a direction of Z in the figure) to the film face of a multi-layered film covering from the free magnetic layer 1 to the anti-ferromagnetic layer 4.

With the tunneling magnetoresistive device, when a voltage is applied to the two ferromagnetic layers (i.e. the free magnetic layer 1 and the fixed magnetic layer 3), an electric current (tunnel current) flows through the insulating barrier layer 6 by the tunneling effect.

Like the spin valve film, the tunneling magnetoresistive device is so arranged that the magnetization of the fixed magnetic layer 3 is fixed in the direction of Y in the figure and the magnetization of the free magnetic layer 1 is arranged in the direction of X in the figure, and the direction of the magnetization varies by the influence of an external magnetic field.

In case where the magnetizations of the fixed magnetic layer 3 and the free magnetic layer 1 are anti-parallel to each other, the tunnel current is most unlikely to pass, with a maximum resistance value. Where the magnetizations of the fixed magnetic layer 3 and the free magnetic layer 1 are parallel to each other, the tunnel current is most likely to pass, with the resistance being minimized.

When the magnetization of the free magnetic layer 1 varies by the influence of an external magnetic field, a varied electric resistance is taken as a variation in voltage, thus permitting a leakage magnetic field from a recording medium to be detected.

The resistance variation rate (TMR ratio, or $\Delta R_{TMR}$) in the tunneling magnetoresistive device is represented by $2P_P P_F/(1-P_P P_F)$ wherein $P_P$ represents a spin polarizability (i.e. the difference in number of electrons between the upspin and the downspin is normalized on the basis of the total number of electrons and this spin polarizability is hereinafter referred to simply as polarizability), and $P_F$ represents a polarizability of the free magnetic layer. As will be seen from the above equation, the resistance variation rate is determined by the polarizabilities of the ferromagnetic layers. As the polarizabilities increase, the resistance variation rate increases theoretically.

The tunneling magnetoresistive device per se, which is composed of the insulating barrier layer 6 interposed between the two ferromagnetic layers 1, 3, was known far back in the past. One of the reasons why the tunneling magnetoresistive effective device has never been put to practical use is that it is necessary to form the insulating barrier layer 6 that is thin enough to cause electrons to be tunneled, and the formation of such a thin uniform insulating barrier layer 6 is very difficult. For instance, thickness of the above-mentioned insulating barrier layer 6 is at several tens of angstroms.

In order to make the insulating barrier layer 6 thin, it has been conventional to form the insulating barrier film 6 according to the following procedure.

More particularly, after formation of an electrode layer 6 and a free magnetic layer 1 in this order as viewed from below, metallic Al is formed as a film on the free magnetic layer 1 such as by sputtering. Next, the metallic Al is oxidized according to a pure oxygen natural oxidation method or an oxygen plasma method to provide $Al_2O_3$, thereby forming an insulating barrier layer 6.

This procedure is advantageous, over the case where $Al_2O_3$ is directly formed as a film by sputtering using a target of $Al_2O_3$, in that there can be formed the insulating barrier layer 6 that has a reduced number of defects such as pinholes.

However, with the procedure of forming the insulating barrier layer 6 by oxidation of the metal layer as set out above, it is very difficult to control a pressure and a feed time of oxygen being fed. This leaves the deficiencies that not only the metal layer, but also the free magnetic layer 1 formed beneath the metal layer is oxidized and that the metal layer cannot be oxidized fully, so that part of the metal layer is left in the insulating barrier layer 6.

In this way, the complete oxidation of the metal layer alone is technically difficult, causing the resistance variation rate to be lowered owing to partial oxidation of the free magnetic layer and the residue of the metal layer. Thus, With a conventional type of laminated tunneling magnetoresistive device formed by laminating the free magnetic layer 1, the insulating barrier layer 6 and the fixed magnetic layer 3, it has been difficult to obtain satisfactory reproducibility.

SUMMARY OF THE INVENTION

It is accordingly an object of the invention to provide a tunneling magnetoresistive device, which can solve the problems of the prior art.

It is another object of the invention to provide a tunneling magnetoresistive device, which can be manufactured in a simple manner and in a highly reproducible way.

It is a further object of the invention to provide a method for manufacturing such a device as mentioned above.

The above objects can be achieved, according to the invention, by a tunneling magnetoresistive device, which comprises a barrier layer, at least two ferromagnetic layers provided on the insulating barrier layer and arranged side by side along the surface of the insulating barrier layer, and a pair of electrode layers, wherein at least the two ferromagnetic layers are kept away from each other at a given space sufficient to show a tunnel effect so that an electric current passing from one of the electrode layers toward one of at least the two ferromagnetic layers is allowed to pass via the insulating barrier layer to the other ferromagnetic layer.

This tunneling magnetoresistive device makes use of the effect that incident electrons from a ferromagnetic layer is transferable to another ferromagnetic layer opposite to an insulating barrier, i.e. a quantum tunnel effect, in the case where the incident electrons have only an energy level insufficient to pass over the insulating barrier from a classical point of view.

In the classical theory, it has been accepted that when V>E wherein a potential of an insulating barrier is taken as V and an energy of incident electrons is taken as E, the incident electron cannot pass through or over the barrier. Nevertheless, when the insulating barrier satisfies some requirements such as of a small thickness, it has been experimentally confirmed that an incident electron can pass through the barrier with a potential of V.

The tunneling magnetoresistive device shown in FIG. 13 includes an insulating barrier interposed between ferromagnetic body L and ferromagnetic body R, and electrodes connected to the ferromagnetic layer L and the ferromagnetic layer R, respectively.

The case where the incident electron energy is lower than a barrier potential, under which the incident electrons pass through the barrier, is one where, as shown in FIG. 13, the wave function of incident electrons and the wave function of transmitted electrons are superposed within a range of film thickness of the insulating barrier. In this case, the incident electrons pass through the barrier to cause a tunnel current to flow.

According to the above theory, where the wave functions of the incident electrons and transmitted electrons do no superpose, any tunnel current does not flow within the barrier, thereby not showing any tunnel effect. Whether or not the superposition of the wave functions takes place relates to the film thickness of the insulating barrier, under which as the film thickness increases, the superposition of the wave functions is more unlikely to occur.

As stated above, the prior art tunneling magnetoresistive device of the laminated type includes a three-layered laminate of ferromagnetic layer/insulating barrier layer/ ferromagnetic layer. In order to appropriately show the tunnel effect, it is necessary to form a thin insulating barrier. In practice, however, it has been technically difficult to form a very thin insulating barrier.

In the practice of the invention, at least two ferromagnetic layers are set on an insulating barrier layer and arranged side by side along the direction of the surface of the insulating barrier layer.

At least the two ferromagnetic layers should be kept away from each other at a given space therebetween wherein the space is so determined as to show a so-called tunnel effect wherein an electric current passing from an electrode layer toward one of at least the two ferromagnetic layer is transmitted The above arrangement is advantageous in that it is not necessary to form a thin insulating barrier layer. More particularly, at least two ferromagnetic layers are set at the insulating barrier layer so that the ferromagnetic layers are arranged side by side along the direction of film surface of the insulating barrier layer to establish a given a space between the ferromagnetic layers, and whether or not a tunnel current flows within the insulating barrier layer depends on the dimension of the space. If the space is large, any tunnel current does not flow within the insulating barrier layer, and any change in resistance (i.e., the TMR effect) does not take place.

The space between the ferromagnetic layers should be formed so narrowly as to show the tunnel effect. For instance, it is considered that the space should preferably be formed approximately at a film thickness of an insulating barrier layer of a known laminated, tunneling magnetoresistive device having three-layer laminate of ferromagnetic layer/insulating barrier layer and ferromagnetic layer.

In this way, the thickness of the insulating barrier layer does not directly influence the occurrence of the tunnel effect in the practice of the invention. The tunnel effect is determined depending on the space between the ferromagnetic layers on the insulating barrier layer. The ferromagnetic layers can be formed after the formation of the insulating barrier layer, so that when the insulating barrier layer is formed by oxidation of a metal layer, it is unnecessary to take the influence on the oxidation of the ferromagnetic layers into account. Thus, it is possible to establish an electric resistance or the like necessary for the insulating barrier layer through complete oxidation of the insulating barrier layer.

As will be apparent from the above, the insulating barrier layer formed by complete oxidation of a metal layer can be formed without influencing the oxidation of the ferromagnetic layers in the practice of the invention. In addition, since the insulating barrier layer can be formed as thick, the formation of the insulating barrier layer that has a reduced number of defects such as pinholes or the like is enabled. Thus, there can be manufactured a device, which is higher in reproducibility and more stable than known laminated, tunneling magnetoresistive device.

Moreover, in the practice of the invention, it is preferred that at least one of at least the two ferromagnetic layers consists of a fixed magnetic layer wherein magnetization is fixed in a given direction, and at least one thereof consists of a free magnetic layer. In this connection, it is more preferred that the free magnetic layer has such magnetization uniformly arranged in a direction crossing to the direction of magnetization of the fixed magnetic layer.

Further, it is preferred that an antiferromagnetic layer is formed in contact with the fixed ferromagnetic layer so that the magnetization of the fixed magnetic layer is fixed in the given direction through the exchange anisotropic magnetic field occurring between the antiferromagnetic layer and the fixed magnetic layer.

In the case, at least the free magnetic layer may be formed as exposing to the surface opposite to a recording medium.

The free magnetic layer may have an antiferromagnetic layer formed in contact therewith at least at one end thereof, so that the magnetization of the free magnetic layer is uniformly arranged in a direction crossing to the magnetization of the fixed magnetic layer owing to the exchange anisotropic magnetic field occurring between the free magnetic layer and the antiferromagnetic layer. Alternatively, the free magnetic layer may have a bias layer at opposite sides or at one side thereof along the direction of track width, so that the magnetization of the free magnetic layer is uniformly arranged in a direction crossing to the direction of magnetization of the fixed magnetic layer by the influence of a bias magnetic field from the bias layer.

In the practice of the invention, it is preferred to provide three ferromagnetic layers that include one free magnetic layer and two fixed magnetic layers and are so arranged that the free magnetic layer and the fixed magnetic layers are, respectively, provided at given spaces to permit an electric current from an electrode layer flows via the insulating barrier layer to one fixed magnetic layer-free magnetic layer-the other fixed magnetic layer in this order. Moreover, a pair of electrode layers should preferably be provided directly or indirectly at the fixed magnetic layers, respectively.

The reason why the three ferromagnetic layers are provided resides in that the resistance value is reduced by the resonance tunnel effect. The fundamental principle of the resonance tunnel effect in the case where the three ferromagnetic layers are provided is illustrated with reference to FIG. 14. FIG. 14 schematically shows a case where any bias voltage is not applied between the electrode layers.

As shown in FIG. 14, a barrier exists between ferromagnetic body L and ferromagnetic body M and also between the ferromagnetic body M and ferromagnetic body R, respectively, and electrodes are connected to the ferromagnetic body L and the ferromagnetic body R, respectively.

As shown in FIG. 14, there exist electron 1 and electron 2 having different energies in ferromagnetic body L.

Electron 1 is unlikely to pass through an insulating barrier, with its transmittance being very low. On the other hand, although electron 2 is lower in energy than electron 1, it can completely pass through the insulating barrier with its transmittance being at 1.

The reason why electron 2 of lower energy is more likely to pass through the insulating barrier in this way is ascribed to the fact that the energy (represented as bound level in FIG. 14) which an electron is able to take is discrete in ferromagnetic body M.

If this bound level and the energy of the incident electron 2 are resonant (coincident) with each other, the transmittance of the incident electron 2 comes to 1, thus permitting the resistance value to be lowered.

In the case where the three ferromagnetic layers are provided while making use of the above-mentioned resonance tunnel effect, two insulating barrier layers each having a small thickness have to be formed for a structure wherein ferromagnetic body L/insulating barrier/ferromagnetic body M/insulating barrier/ferromagnetic body R are laminated in this order from below, like a prior art device. This makes it more difficult to manufacture in comparison with a tunneling magnetoresistive device where only one insulating barrier layer 6 is formed as shown in FIG. 16, resulting in the considerable lowering of yield.

In contrast thereto, according to the invention, an insulating barrier layer has been previously formed by oxidation of a metal layer, and only three ferromagnetic layers are provided on the insulating barrier layer on the same plane, thereby forming a tunneling magnetoresistive device making use of the resonance tunnel effect. This makes it easier to manufacture over a prior art case, thus enabling one to manufacture the tunneling magnetoresistive device in high yield.

Furthermore, in the practice of the invention, three ferromagnetic layers are provided including two free magnetic layers and one fixed magnetic layer wherein the free magnetic layers and the fixed magnetic layer should preferably be so set as to make a given space between any adjacent layers in such a way that an electric current from an electrode layer flows via the insulating barrier layer in the order of one free magnetic layer-fixed magnetic layer-the other free magnetic layer. In addition, it is preferred that a pair of electrodes is, respectively, connected to the respective free magnetic layers.

In the invention, the antiferromagnetic layers are each formed of an X—Mn alloy wherein X represents one or more of Pt, Pd, Ir, Rh, Ru and Os. These antiferromagnetic layers are advantageous in that they have a large exchange anisotropic magnetic field and a high blocking temperature.

Moreover, it is also preferred that the ferromagnetic layer is formed of either a ferromagnetic metal or half metal.

As stated hereinabove, the TMR ratio is theoretically determined by the polarizability of ferromagnetic layer.

Accordingly, the use of a ferromagnetic layer of high polarizability is preferred from the standpoint of improving the TMR ratio.

In the practice of the invention, the ferromagnetic layers are formed of either a ferromagnetic metal or half metal wherein some kind of half metal has a polarizability at or near 1, so that when if a half metal is used for the ferromagnetic layers, it is theoretically possible to maximize the TMR ratio.

The ferromagnetic layers should preferably be formed of one or more of an NiFe alloy, a CoFe alloy, a Co alloy, a CoNiFe alloy.

Further, in the practice of the invention, the ferromagnetic layers should preferably made of either a ferromagnetic metal or half metal formed of a perovskite-type oxide represented by $R_{1-x}A_xMnO_3$ wherein R represents one or more elements selected from trivalent rare earth metal ions such as $La^{3+}$, $Pr^{3+}$, $Nd^{3+}$ and like, A represents one or more elements selected from divalent alkaline earth metal ions such as $Ca^{2+}$, $Sr^{2+}$, $Ba^{2+}$ and the like, and X is a compositional ratio.

In the above formula, it is preferred that R is $La^{3+}$, A is $Sr^{2+}$, and the compositional ratio of x is at 0.17 or over.

Alternatively, it is also preferred that the ferromagnetic layers are formed of a Heusler's alloy of $A_2MnX$ or AMnX wherein A represents one or more elements selected from Cu, Au, Pd, Ni and Co, and X represents one or more elements selected from Al, In, Sn, Ga, Ge, Sb and Si.

In the practice of the invention, the insulating barrier layer should preferably be formed of an insulating material of an oxide of a metal and/or a semiconductor.

More particularly, the insulating material should preferably be made of an oxide of at least one element selected from Al, Mg, Nb, Ni, Gd, Ge, Si and Hf.

Where the insulating barrier layer is formed of a metal oxide and/or an oxide of a semiconductor, the metal and/or semiconductor is sputtered to form a film, followed by oxidation of the metal and/or semiconductor layer according to a pure oxygen natural oxidation method or an oxygen plasma method, thereby forming an insulating barrier layer made of an oxide of the metal and/or semiconductor.

In the invention, the insulating barrier layer should preferably be made of a paramagnetic insulator formed of a perovskite-type oxide, $R_{1-x}A_xMNO_3$ wherein R represents one or more trivalent rare earth metal ions such as $La^{3+}$, $Pr^{3+}$, $Nd^{3+}$ and like, A represents one or more elements selected from divalent alkaline earth metal ions such as $Ca^{2+}$, $Sr^{2+}$, $Ba^{2+}$ and the like, and X is a compositional ratio.

In this case, it is more preferred that R is $La^{3+}$, A is $Sr^{2+}$, and the compositional ratio of x is 0.26 or below. Alternatively, it is more preferred that R is $Pr^{3+}$, and A is $Ca^{2+}$.

Moreover, it is preferred that the insulating barrier layer should have a granular structure wherein fine granules of a metal are dispersed in an insulator matrix.

When the insulating barrier layer has a granular structure wherein fine granules of a metal are dispersed in a perovskite-type oxide, $R_{1-x}A_xMnO_3$, or an insulator matrix and the insulating barrier layer is formed of $Al_2O_3$, the tunnel effect can be appropriately shown even though the space is formed wider than a required space to be kept between the ferromagnetic layers. This enables one to alleviate the processing accuracy, thus leading to ease in manufacturing process.

The method for manufacturing a tunneling magnetoresistive device according to the invention is characterized by comprising the steps of:

(a) forming a metal layer on a substrate;

(b) forming an insulating barrier layer by oxidation of the metal layer;

(c) forming a ferromagnetic layer on the insulating barrier layer; and (d) forming, in the ferromagnetic layer, a space sufficient to show a tunnel effect so that an electric current tunnels or flows within the insulating barrier layer.

According to the above manufacturing method, the metal layer is initially formed on the substrate and oxidized to form the insulating barrier layer. Thereafter, the ferromagnetic layer is formed on the insulating barrier layer.

Accordingly, any ferromagnetic layer is not formed when the metal layer is oxidized. Thus, the metal layer can be oxidized without taking the influence on the oxidation of the ferromagnetic layer into consideration, making the manufacturing process easy or simple.

According to the invention, since the insulating barrier layer can be formed as thick, so that defects such as pinholes or the like are unlikely to occur in the insulating barrier layer, thereby forming a tunneling magnetoresistive effective device having stable characteristics.

The method for manufacturing a tunneling magnetoresistive device according to another embodiment of the invention is characterized by comprising the steps of:

(e) forming an insulating barrier layer of a paramagnetic insulator made of a perovskite-type oxide represented by $R_{1-x}A_xMnO_3$ wherein R represents one or more elements selected from trivalent rare earth metal ions such as $La^{3+}$, $Pr^{3+}$, $Nd^{3+}$ and like, A represents one or more elements selected from divalent alkaline earth metal ions such as $Ca^{2+}$, $Sr^{2+}$, $Ba^{2+}$ and the like, and X is a compositional ratio;

(f) forming a ferromagnetic layer made of either a ferromagnetic metal or half metal consisting of $R_{1-x}A_xMnO_3$ wherein R represents one or more elements selected from trivalent rare earth metal ions such as $La^{3+}$, $Pr^{3+}$, $Nd^{3+}$ and like, A represents one or more elements selected from divalent alkaline earth metal ions such as $Ca^{2+}$, $Sr^{2+}$, $Ba^{2+}$ and the like, and X is a compositional ratio; and (g) forming, in the ferromagnetic layer, a space sufficient to show a tunnel effect so that an electric current tunnels or flows within the insulating barrier layer.

In this embodiment, after the formation of the ferromagnetic layer on the substrate in the step (f), a space is formed in the ferromagnetic layer in the step (g). Finally, the insulating barrier layer in step (e) may be formed on the ferromagnetic layer.

In the practice of the invention, a perovskite-type oxide represented by $R_{1-x}A_xMnO_3$ is used to form the insulating barrier, for which it is preferred that R represents $La^{3+}$, A represents $Sr^{2+}$ and X is 0.26 or below. It is also preferred that R is $Pr^{3+}$ and A is $Ca^{2+}$. In this way, the perovskite-type oxide of the formula, $R_{1-x}A_xMnO_3$, can be formed as a paramagnetic insulator.

Moreover, with the perovskite-type oxide of the formula, $R_{1-x}A_xMnO_3$, used to form the ferromagnetic layer in the step (f), it is preferred that R represents $La^{3+}$, A represents $Sr^{2+}$ and x is 0.17 or over. This permits the perovskite-type oxide of the formula, $R_{1-x}A_xMnO_3$, to be formed as a ferromagnetic metal.

In the above manufacturing method, both insulating barrier layer and ferromagnetic layer can be formed of a perovskite-type oxide of the formula, $R_{1-x}A_xMnO_3$. Accordingly, the insulating barrier layer and ferromagnetic layer can be formed by epitaxial growth, and thus, a thin, smooth insulating barrier layer can be formed. Proper control of the compositional ratio in the perovskite-type oxide, $R_{1-x}A_xMnO_3$, makes it possible to form an insulating barrier layer that is lower in electric resistance than $Al_2O_3$. In addition, when ferromagnetic layers formed on the insulating barrier layer can be formed at a wide space therebetween, an appropriate tunnel effect can be expected. Thus, processing accuracy can be alleviated, and the manufacturing procedure can be made easy along with an improved yield.

DETAILED DESCRIPTION OF THE PREFERRED EMBODIMENTS

Figure 1:
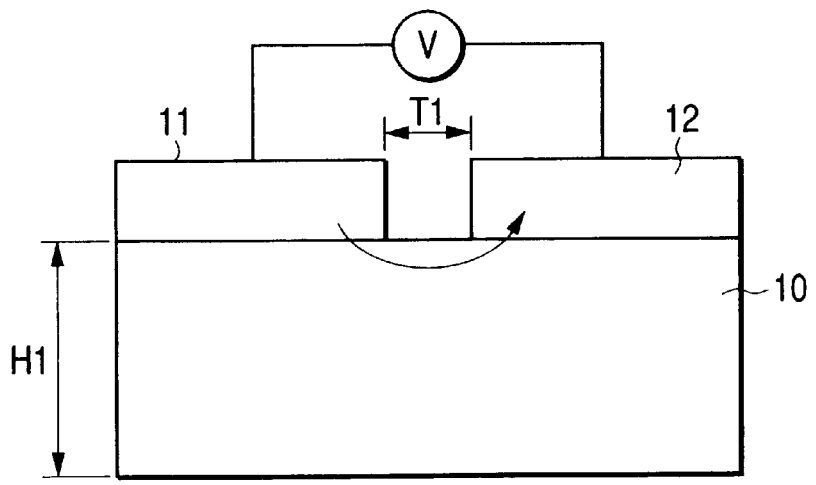
FIG. 1 is a partial schematic view showing a fundamental structure of a tunneling magnetoresistive device according to the invention.

FIG. 1 is a partial schematic view showing a fundamental structure of a tunneling magnetoresistive device according to the invention.

Reference numeral 10 in FIG. 1 indicates an insulating barrier layer, and the insulating barrier layer 10 is formed in a thickness of H1.

In this invention, ferromagnetic layers 11, 12 are formed on the insulating barrier layer 10. As shown in FIG. 1, the ferromagnetic layers 11, 12 are provided directly on the insulating barrier layer 10 and are arranged side by side on the insulating barrier layer 10. It is to be noted that the ferromagnetic layers 11, 12 are provided directly on the insulating barrier layer 10.

The ferromagnetic layers 11, 12 should be kept away from each other at a given space of T1. In the practice of the invention, the insulating barrier layer 10 should preferably be formed of an insulating material composed of an oxide of a metal and/or a semiconductor.

More particularly, the insulating material should preferably be made of an oxide of at least one element selected from Al, Mg, Nb, Ni, Gd, Ge, Si and Hf. That is, the insulating barrier layer 10 is formed of $Al_2O_3$, $AlO_x$, $GeO_x$, NiO, $GdO_x$, MgO or the like.

Alternatively, the insulating barrier layer 10 may be formed of a paramagnetic insulator that is made of a perovskite-type oxide of the formula, $R_{1-x}A_xMnO_3$ wherein R represents one or more elements selected from trivalent rare earth metal ions such as $La^{3+}$, $Pr^{3+}$, $Nd^{3+}$ and like, and A represents one or more elements selected from divalent alkaline earth metal ions such as $Ca^{2+}$, $Sr^{2+}$, $Ba^{2+}$ and the like. In this connection, it is preferred that R is $La^{3+}$, A is $Sr^{2+}$, and the compositional ratio of x is at 0.26 or below. It is also preferred that R is $Pr^{3+}$ and A is $Ca^{2+}$.

In the invention, the insulating barrier layer 10 should preferably have a granular structure wherein fine granules of a metal are dispersed in an insulator matrix.

In order to show an appropriate tunnel effect in the tunneling magnetoresistive device composed of the ferromagnetic layers 11, 12 and the insulating barrier layer 10, the space T1 established between the ferromagnetic layers 11, 12 should permit a tunnel current to appropriately flow within the insulating barrier layer 10 between the ferromagnetic layers 11, 12.

Figure 13:
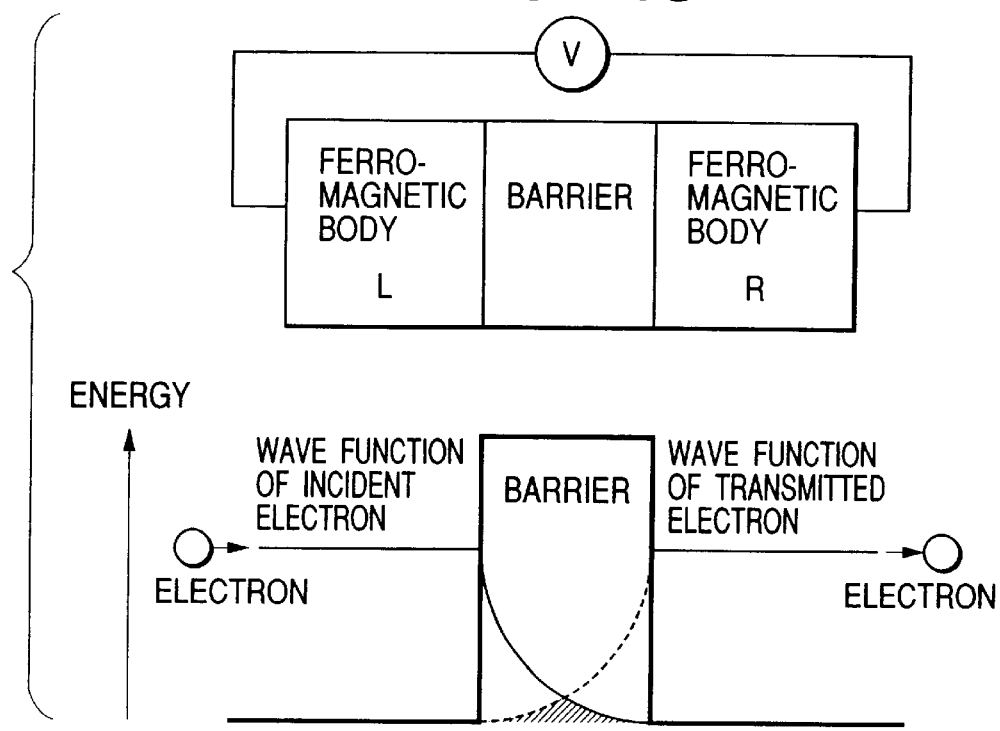
FIG. 13 is an illustrative view showing a fundamental principle of a tunnel effect of a tunneling magnetoresistive device composed of a three-layered structure including ferromagnetic body L/insulating barrier/ferromagnetic body R.

More particularly, if the space T1 between the ferromagnetic layers 11, 12 is too large, the wave function of an incident electron from the ferromagnetic layer 11 and the wave function of a transmitted electron does not superpose within the insulating barrier layer 10 at the space T1 (see FIG. 13), so that the incident electron cannot pass through the insulating barrier layer 10, thereby not allowing any tunnel current to flow.

Accordingly, the space T1 between the ferromagnetic layers 11, 12 should have a size that permits the wave function of an incident electron from the ferromagnetic layer 11 and the wave function of a transmitted electron to be superposed within the insulating barrier layer 10 at the space T1, resulting in the flow of tunnel current.

For instance, the space T1 should preferably correspond to a thickness of an insulating barrier layer of a conventional laminated, tunneling magnetoresistive device which has a lamination of ferromagnetic layers and an insulating barrier layer. More particularly, the space T1 should preferably ranges from approximately 10 angstroms to 20 angstroms.

With the tunneling magnetoresistive device shown in FIG. 1 where the directions of magnetization of the ferromagnetic layer 11 and the ferromagnetic layer 12 are in parallel to each other, conductance G (reciprocal of resistance) becomes maximal, with a maximal tunnel current. On the other hand, where the directions of magnetization of the ferromagnetic layer 11 and the ferromagnetic layer 12 are in an antiparallel relation with each other, conductance G is minimized, with a minimal tunnel current.

With the tunneling magnetoresistive device, the magnetoresistance variation rate (TMR ratio, $\Delta R_{TMR}$) is expressed by $(G_{AP}^{-1} - G_P^{-1})/G_P^{-1}$ wherein $G_{AP}$ represents a conductance (minimal value) where the ferromagnetic layer 11 and the ferromagnetic layer 12 are in an antiparallel relation with respect to their magnetization, and $G_P$ represents a conductance (maximal value) where the ferromagnetic layers 11, 12 are in parallel to each other with respect to the magnetization thereof.

The above equation can be converted in the following manner:

$$\Delta R_{TMR} 2 P_{11} P_{12}/(1 - P_{11} P_{12})$$

wherein $P_{11}$ represents a polarizability of the ferromagnetic layer 11 and $P_{12}$ represents a polarizability of the ferromagnetic layer 12.

From the above equation, the resistance variation rate (TMR ratio) is theoretically dominated with the polarizabilities of the ferromagnetic layers 11, 12, and if the polarizabilities of the ferromagnetic layers 11, 12 are increased, the resistance variation rate can be increased. There can be expected a resistance variation rate that is several to several tens of the resistance variation rate of a GMR (giant magnetoresistive) device, such as a spin valve film or the like, which is mainly used as a reproducing head in recent years.

In the practice of the invention, the tunneling magnetoresistive device having such a structure shown in FIG. 1, i.e. a structure wherein the ferromagnetic layers 11, 12 are arranged on the insulating barrier layer 10 in plane, can be usable as a reproducing head mounted, for example in a hard disk device.

Figure 2:
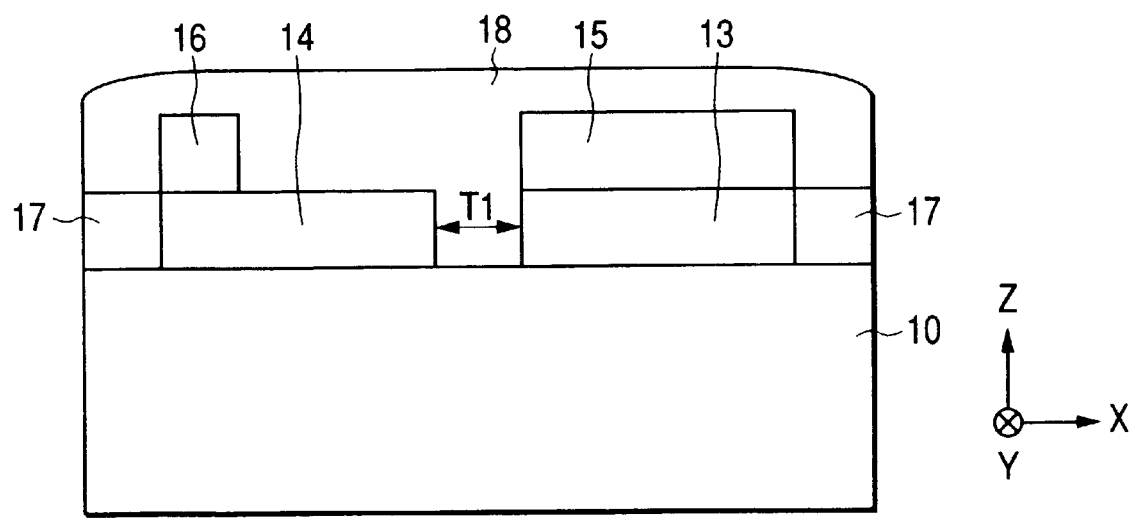
FIG. 2 is a partial schematic view showing one type of tunneling magnetoresistive device for use as a reproducing head mounted in a hard disk device as viewed from a side opposite to a recording medium.
Figure 3:
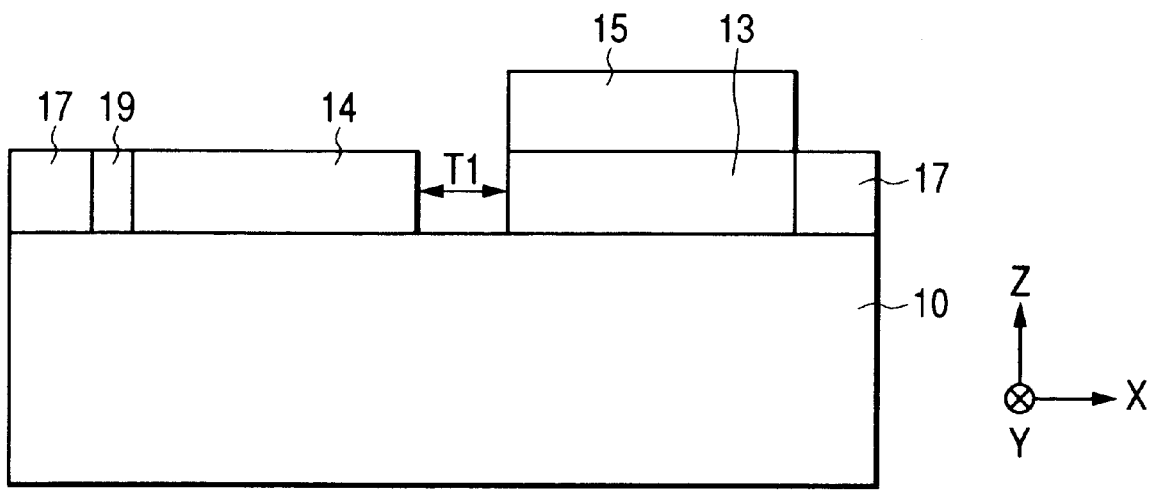
FIG. 3 is a partial schematic view showing another type of tunneling magnetoresistive device for use as a reproducing head mounted in a hard disk device as viewed from a side opposite to a recording medium.

FIGS. 2 and 3 are, respectively, schematic views showing the tunneling magnetoresistive device of FIG. 1 applied to a reproducing head for a hard disk device. In FIGS. 2, 3, the tunneling magnetoresistive device is depicted as a front view as viewed from a side opposite to a recording medium.

The reproducing head (i.e. tunneling magnetoresistive device) detects a leakage magnetic field from a recording medium such as of a hard disk device while making use of a magnetoresistive effect, thereby reading recording signals. In the invention, there may be used a so-called composite thin film magnetic device (head) wherein an inductive head for recording is laminated on the tunneling magnetoresistive device.

As shown in FIG. 2, two ferromagnetic layers 13, 14 are provided directly on an insulating barrier layer 10 formed in a thickness of H1, and are arranged in a direction of the surface of the insulating barrier layer. It will be noted that the ferromagnetic layers 13, 14 may be arranged indirectly on the surface of the insulating barrier layer.

The ferromagnetic layer 13 consists of a fixed magnetic layer, and the other ferromagnetic layer 14 consists of a free magnetic layer. The ferromagnetic layer 13 is hereinafter referred to as fixed magnetic layer 13, and the ferromagnetic layer 14 as free magnetic layer 14.

In the practice of the invention, the fixed magnetic layer 13 and the free magnetic layer 14 should preferably formed of a ferromagnetic metal or half metal, respectively.

It has been found that the resistance variation rate (TMR ratio) theoretically increases with an increasing polarizability of the ferromagnetic layer.

Accordingly, when the fixed magnetic layer 13 and the free magnetic layer 14 are, respectively, formed of a ferromagnetic metal or half metal, the polarizabilities of the fixed magnetic layer 13 and the free magnetic layer 14 can be favorably increased, thereby improving the resistance variation rate (TMR ratio).

For instance, it is preferred that the fixed magnetic layer 13 and the free magnetic layer 14 are, respectively, formed of one or more of an NiFe alloy, a CoFe alloy, a Co alloy and a CoNiFe alloy. These alloys are all ferromagnetic in nature.

Also, the ferromagnetic layers should preferably be made of a perovskite-type oxide represented by $R_{1-x}A_xMnO_3$ wherein R represents one or more elements selected from trivalent rare earth metal ions such as $La^{3+}$, $Pr^{3+}$, $Nd^{3+}$ and like, A represents one or more elements selected from divalent alkaline earth metal ions such as $Ca^{2+}$, $Sr^{2+}$, $Ba^{2+}$ and the like, and X is a compositional ratio. This perovskite-type oxide of $R_{1-x}A_xMnO_3$ is described in more detail hereinafter with respect to its properties and crystal structure.

In the invention, it is preferred that R is $La^{3+}$, A is $Sr^{2+}$ and the compositional ratio of x is 0.17 or over. Such a perovskite-type oxide of $R_{1-x}A_xMnO_3$ as defined above results in a ferromagnetic metal or half metal, with its polarizability being known at or near 1.

Moreover, the fixed magnetic layer 13 and the free magnetic layer 14 are preferably formed of a Heusler's alloy, respectively. The Heusler's alloy is represented by $A_2MnX$ or AMnX wherein A represents one or more elements selected from Cu, Au, Pd, Ni and Co, and X represents one or more elements selected from Al, In, Sn, Ga, Ge, Sb and Si.

The feature of this alloy resides in that a ferromagnetic material can be created from the combination of metal elements that are not ferromagnetic in nature. It is known that a Heusler's alloy, such as NiMnSb or the like, has a polarizability of 1 or near 1.

When the perovskite-type oxide of $R_{1-x}A_xMnO_3$ or the Heusler's alloy is used as the fixed magnetic layer 13 and the free magnetic layer 14, respectively, it is theoretically possible to increase the resistance variation rate (TMR ratio)

As shown in FIG. 2, the given space T1 is created between the fixed magnetic layer 13 and the free magnetic layer 14. As illustrated with reference to FIG. 1, the space T1 is formed in a size sufficient to permit a tunnel current to flow within the insulating barrier layer 10 between the fixed magnetic layer 13 and the free magnetic layer 14.

As shown in FIG. 2, an antiferromagnetic layer 15 is formed on the fixed magnetic layer 13.

The antiferromagnetic layer 15 should preferably be formed of X—Mn wherein X represents one or more elements selected from Pt, Pd, Ir, Rh, Ru and Os. It is preferred to select Pt as X, thereby forming the antiferromagnetic layer 15 made of a PtMn alloy.

The X—Mn alloy is more excellent in corrosion resistance than an NiMn alloy or FeMn alloy ordinarily employed as an antiferromagnetic layer. In addition, the alloy has a high blocking temperature and a great exchange coupling magnetic field (exchange anisotropic magnetic field).

As shown in FIG. 2, the fixed magnetic field 13 and the antiferromagnetic layer 15 are formed in contact. Upon annealing (thermal treatment) in a magnetic field, the exchange coupling magnetic field (exchange anisotropic magnetic field) generates at the interface between the fixed magnetic layer 13 and the antiferromagnetic layer 15. As shown in FIG. 2, for example, the magnetization of the fixed magnetic layer 13 is fixed in a direction of height (i.e. in a direction of Y in the figure).

Moreover, as shown in FIG. 2, an antiferromagnetic layer 16 is also formed on the free magnetic layer 14. The antiferromagnetic layer 16 may be formed of either the same material as or a material different from the antiferromagnetic layer 15 formed on the fixed magnetic layer 13.

The free magnetic layer 14 is so arranged that its magnetization is in a direction crossing to that of the fixed magnetic layer 13 or in a direction of track width (in a direction of X in the figure), according to an exchange bias system based on the exchange anisotropic magnetic field with the antiferromagnetic layer 16 formed on the free magnetic layer 14. Thus, the magnetization can be readily varied under the influence of an external magnetic field.

Moreover, as shown in FIG. 2, the antiferromagnetic layer 16 is formed, at least, on the end portion at one side of the free magnetic layer 14. At one-sided end portions of the antiferromagnetic layer 16 and the free magnetic layer 14, an exchange anisotropic magnetic field generates by annealing in a magnetic field, so that magnetization at the one-sided end portion of the free magnetic layer 14 is strongly fixed in the direction of X in the figure.

The other area of the free magnetic layer 14 is influenced by the magnetization in the direction of X in the figure from the one-sided end portion of the free magnetic layer 14, so that the magnetization of the free magnetic layer as a whole is uniformly arranged in the direction of X in the figure. It will be noted that the magnetization of the free magnetic layer 14 in an area other than those where the antiferromagnetic layer 16 is provided is approximately at a level permitting easy variation by the influence of an external magnetic field.

It should be noted that, as shown in FIG. 2, the antiferromagnetic layer 16 is provided on the end portion at an outer side of the free magnetic layer 14 that is most distant from the fixed magnetic layer 13. The reason why the antiferromagnetic layer 16 is formed at a position most distant from the fixed magnetic layer 13 is that any tunnel effect is not shown between the antiferromagnetic layer 16 and the fixed magnetic layer 13.

As stated hereinabove, when the direction of the fixed magnetization of the fixed magnetic layer 13 and the direction of the magnetization of the free magnetic layer are so set as to cross in a condition of undergoing no influence of an external magnetic field, the variation in resistance variation rate (TMR ratio) can be maximized, thereby improving reproduction sensitivity.

As shown in FIG. 2, electrode layers 17, 17 are formed on an end portion at an outer side in a direction of track width (direction of X in the figure) of the fixed magnetic layer 13 and also on an end portion at an outer side in the direction of track width of the free magnetic layer 14, respectively.

The electrode layers 17 are each formed of W (tungsten) or Cr (chromium).

The electrodes 17 may be formed at positions other those indicated in FIG. 2. For instance, the electrode 17 maybe formed on the antiferromagnetic layer 15 formed on the fixed magnetic layer 13. Moreover, the electrode 17 may be formed at the front of the fixed magnetic layer 13 as viewed in the figure (i.e. at a side opposite to the recording medium, or at the rear and at a side of height of the fixed magnetic layer 13.

Alternatively, the antiferromagnetic layer 16 is formed on the free magnetic layer 14, under which the electrode layer 17 may be formed on an area where the antiferromagnetic layer 16 is absent.

The free magnetic layer 14 may be so arranged as to be exposed to a side opposite to a recording medium.

In this case, the electrode layer 17 should be formed at a portion other than the front, as viewed in the figure, (i.e. a side opposite to the recording medium) of the free magnetic layer 14. For instance, the electrode layer 17 may be formed at the rear portion (or at the rear along the height) of the free magnetic layer 14.

As is particularly shown in FIG. 2, an insulating layer 18 is formed on the electrodes 17, 17, free magnetic layer 14 and antiferromagnetic layers 16, 15, and also within the space T1 between the free magnetic layer 14 and the fixed magnetic layer 13.

When the space T1 established between the free magnetic layer 14 and the fixed magnetic layer 13 is embedded with the insulating layer 18, there is the possibility that a tunnel current flowing between the free magnetic layer 14 and the fixed magnetic layer 13 does not pass within the insulating barrier layer 10, but passes through the insulating layer 18.

In order to permit the tunnel current appropriately flow within the insulating barrier layer 10, it is necessary that the electric resistance of the insulating layer 18 be made significantly higher than that of the insulating barrier layer 10 so as to cause the tunnel current to flow toward the insulating barrier layer 10.

In FIG. 3, the fixed magnetic layer 13 and the free magnetic layer 14 are arranged side by side on the same plane of the insulating barrier layer 10, and the antiferromagnetic layer 15 is formed in contact with the fixed magnetic layer 13. The magnetization of the fixed magnetic layer 13 is fixed in the direction of height thereof (in a direction of Y in the figure).

In this embodiment, a hard bias layer 19 is provided at an end portion of an outer side in the direction of track width (in the direction of X in the figure) of the free magnetic layer 14.

The hard bias layer is formed, for example, of a Co—Pt alloy or a Co—Cr—Pt alloy.

The hard bias layer 19 has been preliminarily magnetized in the direction of track width (in the direction of X in the figure), and the free magnetic layer 14 is magnetized in the direction of X in the figure by the influence of a bias magnetic field from the hard bias layer 19. In this way, the magnetization directions of the fixed magnetic layer 13 and the free magnetic layer 14 has a crossing relation with each other.

As shown in FIG. 3, the free magnetic layer 14 is formed with the hard bias layer 19 only at the outer end portion. In order to reliably arrange the magnetization of the free magnetic layer 14 in the direction of X in the figure, it is preferred to provide the hard bias layer 19 at opposite sides of the free magnetic layer 14.

In the embodiment of FIG. 3, however, if the hard bias layer 19 is formed at opposite sides of the free magnetic layer 14, the hard bias layer 19 has to be formed within the space T1 established between the free magnetic layer 14 and the fixed magnetic layer 13. Since the space T1 is formed very narrowly in order to ensure the tunnel effect, it is considered that the formation of the hard bias layer 19 within the space T1 is very difficult.

Figure 4:
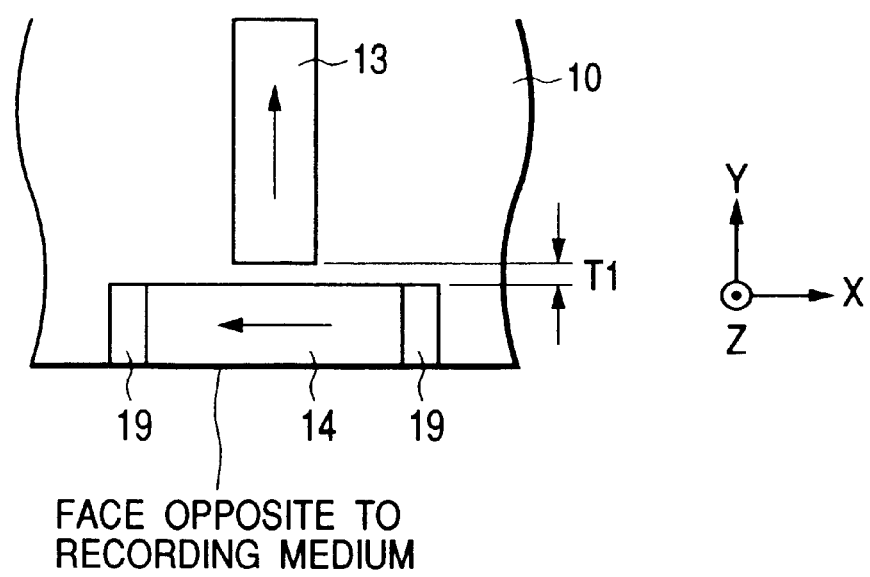
FIG. 4 is a partial plan view showing a further type of tunneling magnetoresistive device for use as a reproducing head mounted in a hard disk device as viewed from above.

Accordingly, the free magnetic layer 14 is formed as exposed to a side opposite to the recording medium, and the fixed magnetic layer 13 is formed at a rear side along the direction of height of the free magnetic layer 14. In this way, there is no layer impeding the formation of the hard bias layer 19 at opposite side of the free magnetic layer along the direction of track width (i.e. the direction of X in the figure), thus enabling one to form the hard bias layer 19 at opposite sides of the free magnetic layer 14 along the direction of track width (the direction of X in the figure). This is particularly shown in FIG. 4. FIG. 4 is a partial plan view of a tunneling magnetic resistive device as viewed from above.

As shown in FIG. 4, the free magnetic layer 14 is formed as exposed to a side opposite to the recording medium, and the fixed magnetic layer 13 is formed at the rear of the free magnetic layer 14 along the direction of height (the direction of Y in the figure) while permitting the space T1 to be established.

The current flowing between the fixed magnetic layer 13 and the free magnetic layer 14 can be tunneled within the insulating barrier layer 10 at the space T1.

Since, as shown in FIG. 4, the fixed magnetic layer 13 is formed at the rear side of the free magnetic layer 14 of the free magnetic layer 13 along the height thereof (in the direction of Y in the figure). It becomes possible to appropriately form the hard bias layer 19 at opposite sides of the free magnetic layer 14 along the trackwidth (in the direction of X in the figure) Thus, the magnetization of the free magnetic layer 14 can be uniformly arranged in the direction of track width without failure.

Although not shown in the figure, the antiferromagnetic layer 15 for fixing the magnetization of the fixed magnetic layer 13 along the height (in the direction of Y in the figure) is formed on the fixed magnetic layer 13.

Next, reference is now made to the position of forming the electrode 17. As shown in FIG. 3, the electrodes 17, 17 are, respectively, formed at outer side end portion of the fixed magnetic layer 13 in the direction of track width and at outer side end portion of the free magnetic layer in the direction of track width via the hard bias layer.

However, the electrode layer 17 may be formed at a position other than one indicated in FIG. 3. More particularly, the electrodes 17, 17 may be formed on the antiferromagnetic layer 15 formed on the fixed magnetic layer 13 or on the free magnetic layer 14. More particularly, the electrode layers 17, 17 may be connected directly or indirectly to the fixed magnetic layer 13.

Alternatively, the electrode 17 may be formed at the rear side of the fixed magnetic layer 13 at the front side as viewed in the figure (i.e. a side opposite to the recording medium) or in the direction of height, or the electrode 17 may be formed at the rear side of the free magnetic layer along the height thereof.

In FIG. 4, the forming positions of the electrode layers 17, 17 are not indicated, and they are formed at such positions as described above. It will be noted that with the case of FIG. 4, only the narrow space T1 ensuring the tunnel effect is open between the fixed magnetic layer 13 and the free magnetic layer 14 at the front end face of the layer 13. In view of the manufacture, it is considered almost impossible to form the electrode 17 at the front end face of the fixed magnetic layer 13.

As shown in FIGS. 2 and 3, the antiferromagnetic layers 15, 16 are formed on the upper sides of the fixed magnetic layer 13 and the free magnetic layer 14. These layers may be formed on a lower side and interposed between the fixed magnetic layer 13 (free magnetic layer 14) and the insulating barrier layer 10.

With the tunneling magnetoresistive device described in detail hereinabove and shown in FIGS. 2 to 4, when the direction of magnetization of the free magnetic layer 14 varies by the influence of an external magnetic field from a recording medium, a tunnel current passing through fixed magnetic layer 13—insulating barrier layer 10—free magnetic layer 14 varies in the quantity of current, and the variation in the current quantity is taken as a variation in electric resistance. The variation in the electric resistance is taken as a variation in voltage, and thus, a leakage magnetic field from the recording medium is detected.

Figure 5:
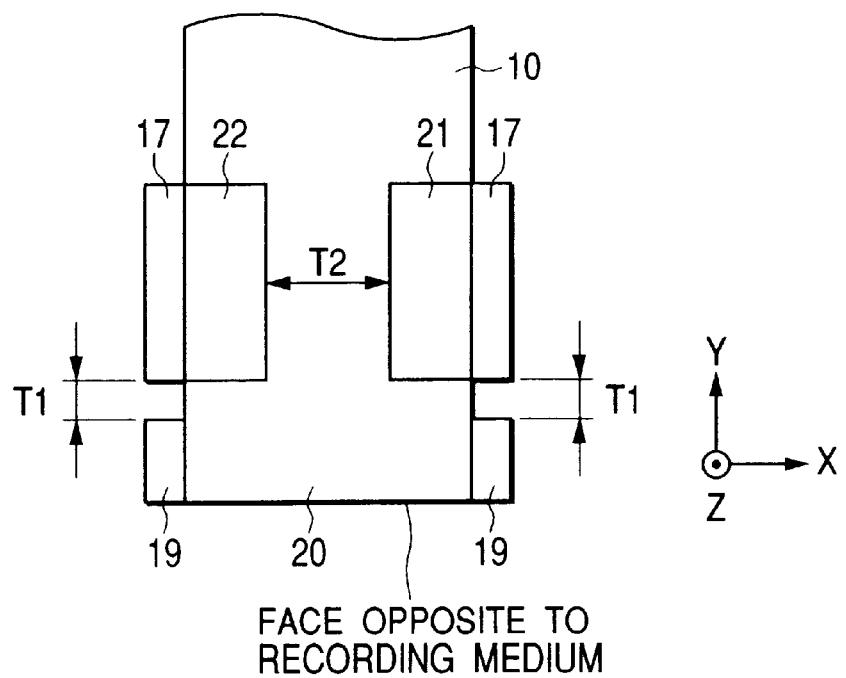
FIG. 5 is a partial plan view showing a still further type of tunneling magnetoresistive device for use as a reproducing head mounted in a hard disk device as viewed from above.
Figure 6:
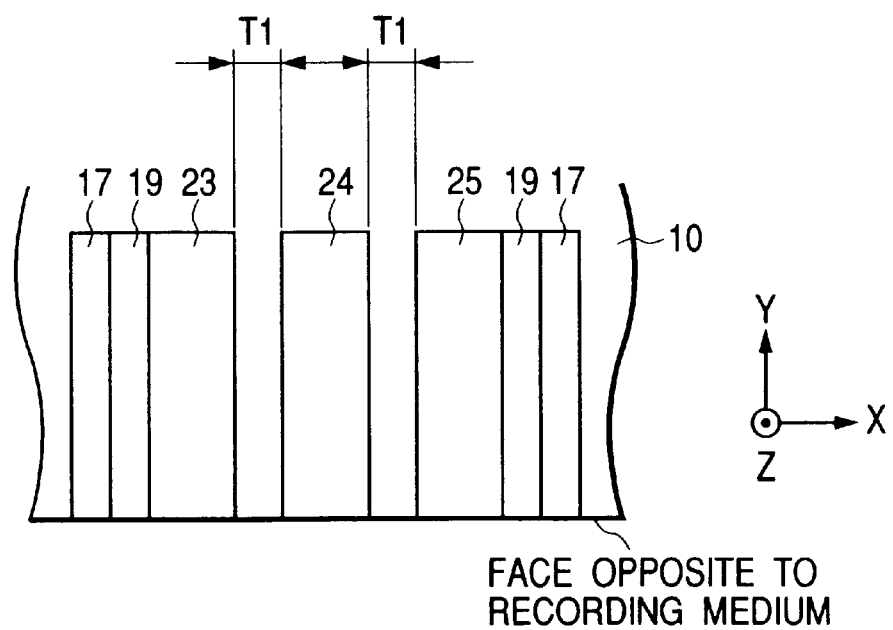
FIG. 6 is a partial plan view showing a yet further type of tunneling magnetoresistive device for use as a reproducing head mounted in a hard disk device as viewed from above.

The tunneling magnetoresistive device shown in FIGS. 5 and 6 shows an arrangement wherein three ferromagnetic layers are formed on the insulating barrier layer 10. The tunneling magnetoresistive device shown in FIGS. 5 and 6 is used, for example, as a reproducing head mounted in a hard disk device. FIGS. 5 and 6 are, respectively, a partial plan view of a tunneling magnetoresistive device as viewed from above.

The reason why the three ferromagnetic layers are formed on the insulating barrier layer 10 as shown in FIGS. 5 and 6 is that a resonance tunnel effect is caused to occur in the current flowing among the ferromagnetic layers, thereby reducing the resistance.

As shown in FIG. 5, three ferromagnetic layers 20, 21, 22 are arranged on the same plane of the insulating barrier layer 10 wherein the ferromagnetic layer 20 consists of a free magnetic layer, and the ferromagnetic layers 21, 22 consist of a fixed magnetic layer, respectively.

The free magnetic layer 20 is formed as exposed to a side opposite to a recording medium, and the fixed magnetic layers 21, 22 are formed at the rear side along the height of the free magnetic layer 20.

An electric current flows as a tunnel current within the insulating barrier layer in the space T1 between the fixed magnetic layer 22 and the free magnetic layer 20 and also within the insulating barrier layer in the space T1 between the free magnetic layer 20 and the fixed magnetic layer 21. The tunnel effect is shown in the fixed magnetic layer 22/insulating barrier layer 10/free magnetic layer 20 and also in the free magnetic layer 20/insulating barrier layer 10/fixed magnetic layer 21.

As shown in FIG. 5, hard bias layers 19, 19 are formed at opposite sides of the free magnetic layer 20 in the direction of track width (in the direction of X in the figure), and are magnetized in the direction of X in the figure. The magnetization of the free magnetic layer 20 is uniformly arranged in the direction of X in the figure by the influence of a bias magnetic filed from the hard bias layer 19. It will be noted that the magnetization of the magnetic layer may be uniformly arranged in the direction of X in the figure by using, in place of the hard bias layer 19, an exchange bias system using an antiferromagnetic layer.

Although not shown, an antiferromagnetic layer made of an X—Mn alloy wherein X represents one or more of Pt, Pd, Ir, Rh, Ru and Os is formed on or beneath the fixed magnetic layers 21, 22. The magnetization of the fixed magnetic layers 21, 22 are fixed in the direction of height (in the direction of Y in the figure) by virtue of the exchange anisotropic magnetic field occurring at the interface with the antiferromagnetic layer.

Next, the formation position of the electrode layers 17, 17 are such that with the arrangement shown in FIG. 5, a pair of electrode layers 17 are preferably formed in direct or indirect contact with the respective fixed magnetic layers 21, 22.

When the electrode layers 17, 17 are formed on the two fixed magnetic layers 21, 22, respectively, a tunnel current flows within the insulating barrier layer 10 between the fixed magnetic layer 21 and the free magnetic layer 20 and also between the free magnetic layer 20 and the fixed magnetic layer 21.

The electrode layers 17, 17 shown in FIG. 5 are provided in contact with the outer side end portion of the respective fixed magnetic layers 21, 22 along the direction of track width (in the direction of X in the figure). Of course, the electrodes 17 may be formed at other positions.

For instance, the electrode layers 17 may be formed on the antiferromagnetic layers on the fixed magnetic layers 21, 22, or may be provided at rear end sides (sides in the direction of height) or inner side end portions in the direction of track width of the respective fixed magnetic layers 21, 22.

As shown in FIG. 5, it will be seen that the electrode layers 17 and the hard bias layers 19 are not provided on the insulating barrier layer 10, but formed on the side faces of the insulating barrier layer 10, respectively.

The reason for this is that when the electrode layers 17 and the hard bias layers 19 are formed on the insulating barrier layer 10 and a space between the electrode 17 and the hard bias layer 19 is at T1 or below, a tunnel current is unfavorably liable to pass between the electrodes 17 and the hard bias layers 19.

In other words, if the space between the electrode layer 17 and the hard bias layer 19 is formed to be at the space of T1 or over, the electrode layer 17 and the hard bias layer 19 may be formed on the insulating barrier layer 10.

In the embodiment shown in FIG. 5, as stated above, the current (tunnel current) flowing from the electrode layer 17 passes via the fixed magnetic layer 21, the insulating barrier layer 10 between the fixed magnetic layer 21 and the free magnetic layer 20, the free magnetic layer 20, the insulating barrier layer 10 between the free magnetic layer 20 and the fixed magnetic layer 22 and the fixed magnetic layer 22. In this way, the current passes in one direction. In order to permit the current to appropriately flow in one direction, the space T1 between the fixed magnetic layers 21, 22 and the free magnetic layer 20 has to be so narrowed as to permit the tunnel current to flow within the insulating barrier layer 10, and a space T2 between the fixed magnetic layers 21, 22 has to be widened so that the tunnel current does not flow within the insulating barrier layer 10 corresponding to the space T2.

As shown in FIG. 5, the space T2 between the two fixed magnetic layers 21, 22 is established. If this space T2 becomes narrow, an electric current from the electrode layer 17 is branched within the insulating barrier layer 10 between the fixed magnetic layers 21, 22, thereby causing the tunnel effect to occur between the fixed magnetic layers 21, 22.

More particularly, the current flowing from the electrode layer 17 is branched into two routes including a route of fixed magnetic layer 21-free magnetic layer 20-fixed magnetic layer 22 and a route of fixed magnetic layer 21-fixed magnetic layer 22. Eventually, the resistance variation rate (TMR ratio) is lowered, thereby causing a reproduction characteristic to be worsened.

In order that the current appropriately flows only in one direction of fixed magnetic layer 21—free magnetic layer 20—fixed magnetic layer 22, a space between the fixed magnetic layers 21, 22 has to be widened to such an extent that any tunnel current does not flow.

As stated hereinabove, the electrode layers 17, 17 may be formed at the inner side end portions of the fixed magnetic layers 21, 22 along the direction of track width. In this case, a space between the electrode layers 17, 17 has to be widened to an extent that any tunnel current does not flow.

FIG. 6 is a partial plan view showing another embodiment of a tunneling magnetoresistive device wherein three ferromagnetic layers are provided on the same plane of the insulating barrier layer 10.

As shown in FIG. 6, three ferromagnetic layers 23, 24, 25 are provided on the same plane of the insulating barrier layer 10. In this embodiment, all of the three ferromagnetic layers 23, 24, 25 are formed as exposed to a side opposite to a recording medium, and are arranged in parallel to each other in the direction of height (in the direction of Y in the figure) from the opposite side to the recording medium.

Among the three ferromagnetic layers, the ferromagnetic layers 23, 25 each consists of a free magnetic layer, and the ferromagnetic layer 24 consists of a fixed magnetic layer.

An antiferromagnetic layer (not shown) that is made of X—Mn wherein X represents one or more elements selected from Pt, Pd, Ir, Rh, Ru and Os is provided on or beneath of the fixed magnetic layer 24. Thus, the magnetization of the fixed magnetic layer 24 is fixed in the direction of Y owing to the exchange anisotropic magnetic field occurring between the antiferromagnetic layer and the fixed magnetic layer 24.

Hard bias layers 19,19 are provided at outer side end portions of the two free magnetic layers 23, 25 in the direction of track width (in the direction of X in the figure), respectively. The hard bias layer 19 is fixed in the direction of X in the figure with respect to its magnetization, and the free magnetic layers 23, 25 are magnetized in the direction of X by the influence of a bias magnetic filed from the hard bias layer 19.

The magnetization of the free magnetic layers 23, 25 may be arranged in the direction of X in the figure according to an exchange bias system using an antiferromagnetic layer in place of the hard bias layer 19.

As shown in FIG. 6, spaces T1 are, respectively, established between the free magnetic layer 23 and the fixed magnetic layer 24 and also between the fixed magnetic layer 24 and the free magnetic layer 25. This space T1 has a size sufficient to permit an electric current to flow within the insulating barrier layer 10 at portions thereof located between the free magnetic layer 23 and the fixed magnetic layer 24 and also between the fixed magnetic layer 24 and the free magnetic layer 25, respectively.

As shown in FIG. 6, electrode layers 17, 17 are provided, via the hard bias layers 19, at outer side end portions of the free magnetic layers 23, 25 along the direction of track width (in the direction of X in the figure). The electrode layers 17 may be formed at other positions, e.g. they may be formed on the free magnetic layers 23, 25, respectively. Alternatively, the electrode layers may be provided at the rear end portions (height sides) of the free magnetic layers 23, 25, respectively.

In this embodiment, the current as a tunnel current flows via the free magnetic layer 23—the insulating barrier layer 10 between the free magnetic layer 23 and the fixed magnetic layer 24—the fixed magnetic layer 24—the insulating barrier layer 10 between the fixed magnetic layer 24 and the free magnetic layer 25—the free magnetic layer 25.

In the embodiments of FIGS. 5 and 6, the three ferromagnetic layers are provided on the insulating barrier layer 10 wherein the resonance tunnel effect is utilized to lower a resistance value.

Figure 14:
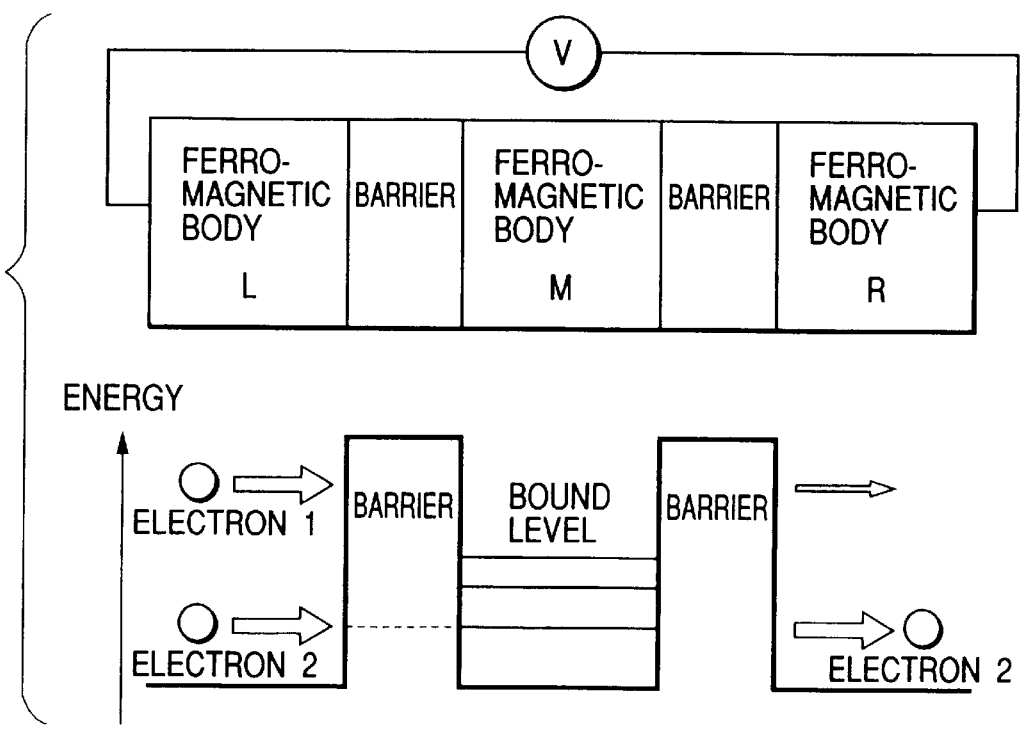
FIG. 14 is an illustrative view showing a resonance tunnel effect of a tunneling magnetoresistive device composed of a five-layered structure including ferromagnetic body L/insulating barrier/ferromagnetic body M/insulating barrier/ferromagnetic body R.
Figure 15:
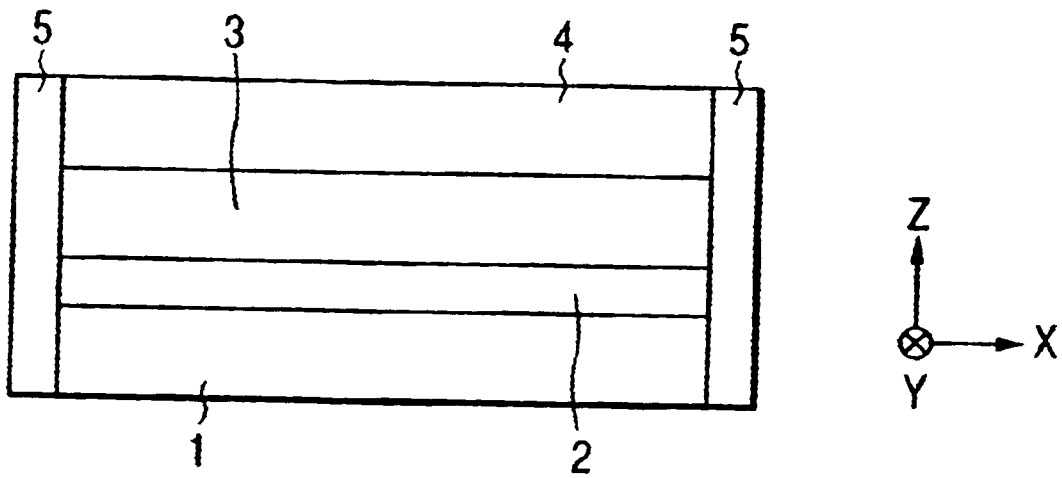
FIG. 15 is a partial schematic view showing a structure of a known GMR device (spin valve film)

With respect to the resonance tunnel effect, as having illustrated with reference to FIG. 14, if the bound level of middle ferromagnetic body M (i.e. the free magnetic layer 20 in FIG. 5 and the fixed magnetic layer 24 in FIG. 6) sandwiched between the insulating barriers and the energy of the incident electron 2 are resonant (coincident) with each other, the transmittance of the electron 2 arrives at 1, under which where a tunnel current passes through the insulating barrier layer 10, the resistance value can be lowered.

It will be noted that in order to improve the resistance variation rate, it is necessary to optimize the order of passage of an electric current (tunnel current) through the ferromagnetic layers. The optimization is performed by permitting the current to alternately flow through the free magnetic layer and the fixed magnetic layer.

More particularly, in the embodiment of FIG. 5, one free magnetic layer 20 and two fixed magnetic layers 21, 22 are provided, and the current should flow in the order of fixed magnetic layer 21—free magnetic layer 20—fixed magnetic layer 22, so that the current passes through the free magnetic layer 20 and the fixed magnetic layers 21, 22 alternately.

In the embodiment of FIG. 6, the two free magnetic layers 23, 25 and one fixed magnetic layer 24 are provided, and the current flows in the order of free magnetic layer 23—fixed magnetic layer 24—free magnetic layer 25 so that the current passes through the free magnetic layers 23, 25 and the fixed magnetic layer 24 alternately.

The alternate passage of the current through the free magnetic layers and the fixed magnetic layers ensures a better tunnel effect than in the case where one free magnetic layer and one fixed magnetic layer are provided, which is considered to result in an improve resistance variation rate (TMR ratio).

However, if the order of passage of the current is such that free magnetic layers or fixed magnetic layers are successively set including, for example, fixed magnetic layer-fixed magnetic layer-free magnetic layer or free magnetic layer-free magnetic layer-fixed magnetic layer, it is considered that the resistance variation rate (TMR ratio) is substantially at the same level as that of the case where only one free magnetic layer and one fixed magnetic layer are provided (see FIG. 2 or 3). The provision of the three ferromagnetic layers enables one to lower the resistance value by the resonance tunnel effect.

In FIGS. 5 and 6, the materials for the insulating barrier layer 10 and the ferromagnetic layers are not described, and the insulating barrier layer 10 and the ferromagnetic layers can be formed of such materials as illustrated with reference to FIG. 1, respectively.

The tunneling magnetoresistive devices of the invention illustrated in FIGS. 1 to 6 should have at least two ferromagnetic layers provided directly or indirectly on the insulating barrier layer 10 and arranged on the insulating barrier layer 10 along the direction of the surface thereof. Using this arrangement, the insulating barrier layer 10 can be formed with a reduced number of defects such as pinholes in comparison with a known device wherein ferromagnetic layers and an insulating barrier layer are successively laminated. Thus, a stable output can be reproducibly obtained.

Figure 7:
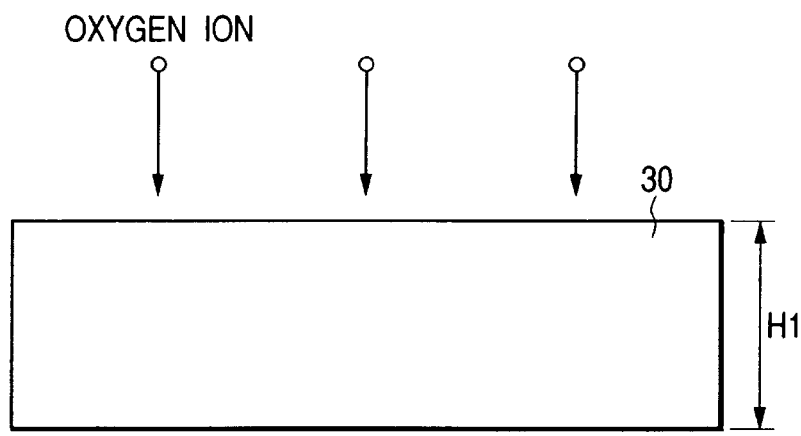
FIG. 7 is a view showing one step of a method for manufacturing a tunneling magnetoresistive device according to the invention.
Figure 8:
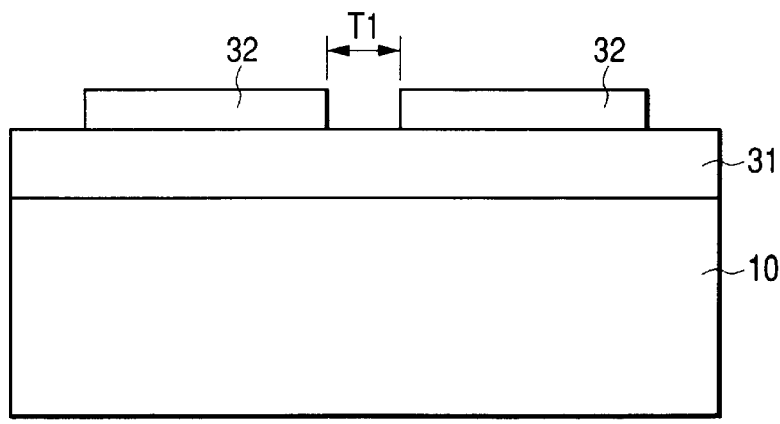
FIG. 8 is a view showing a next step of FIG. 7.
Figure 9:
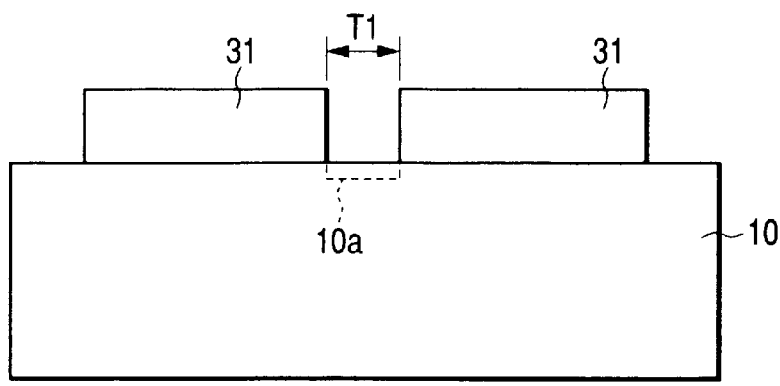
FIG. 9 is a view showing a subsequent step of FIG. 8.

FIGS. 7 to 9 are, respectively, a view showing one step in a method for manufacturing a tunneling magnetoresistive device according to the invention.

As shown in FIG. 7, a metal layer 30 having a thickness of H1, e.g. a Al layer, is formed on a substrate.

Next, oxygen ions are collided against the metal layer 30, for example by an oxygen plasma technique, so that the metal layer 30 is oxidized to form an insulating barrier layer 10 made of $Al_2O_3$ (alumina). The technique of oxidizing the metal layer 20 may not be the oxygen plasma technique. For instance, a pure oxygen natural oxidation technique or other oxidation techniques may be used for this purpose.

The metal layer 30 is formed in the thickness of HI. In the practice of the invention, the thickness HI may be larger than the thickness of an insulating barrier layer of a conventional laminated, tunneling magnetoresistive device.

Figure 16:
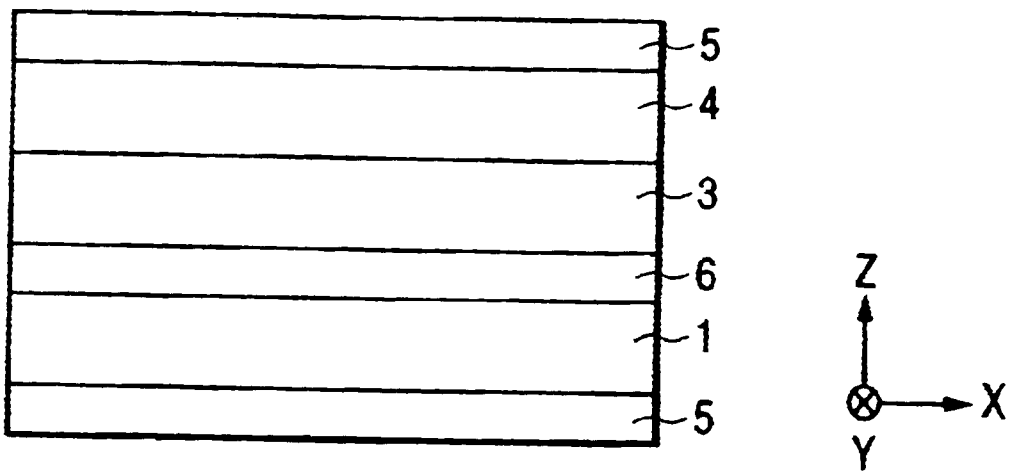
FIG. 16 is a partial schematic view showing a structure of a known tunneling magnetoresistive device.

More particularly, with the conventional laminated, tunneling magnetoresistive device shown in FIG. 16, it is necessary to form the insulating barrier layer 6 so thin as to permit a tunnel current to flow therethrough in order that the tunnel current flows in a direction vertical to the surface of the insulating barrier layer 6.

In the invention, however, the tunnel current flowing the insulating barrier layer 10 does not flow in a direction vertical to the surface of the insulating barrier layer 10, but flows in a direction parallel to the layer surface. This is the reason why the thickness H1 of the insulating barrier layer 10 can be made large. Thus, the formation of the insulating barrier layer 10 can be made easy.

In case where the insulating barrier layer 6 has to be formed in a very small thickness as in the prior art, defects such as pinholes are liable to occur in the insulating barrier layer 6. In the practice of the invention, the insulating barrier layer 10 can be formed in a large thickness of H1, and thus, defects such as pinholes are unlikely to occur in the insulating barrier layer 10.

Further, as illustrated in a subsequent step of the invention, ferromagnetic layers are formed on the insulating barrier layer 10 after the formation thereof, so that unlike a conventional laminated, tunneling magnetoresistive device, there is little possibility that when the metal layer is oxidized, the influence of the oxidation extends to the ferromagnetic layers.

That is, where the insulating layer 6 is formed by oxidation of a metal layer for the case of the conventional laminated, tunneling magnetoresistive device shown in FIG. 16, it is necessary to appropriately control an oxidation time, a pressure of oxygen being charged and the like. Otherwise, oxidation would extend not only to the metal layer, but also to the surface of the ferromagnetic layer (free magnetic layer) 1 provided at the lower side of the insulating barrier layer 6. Alternatively, the metal layer would not be fully oxidized, with part of the metal layer left in the insulating barrier layer 6. In this way, if the ferromagnetic layer is oxidized as well or part of the metal layer is left, the resistance variation rate becomes small, causing a reproduction characteristic to be worsened. Especially, with the case of the laminated, tunneling magnetoresistive device, since the insulating barrier layer 6 is formed in a very small thickness, it is extremely difficult to properly oxidize the metal layer alone thereby forming the insulating barrier layer 6.

On the other hand, in the practice of the invention, the insulating barrier layer 10 is initially formed on a substrate, after which ferromagnetic layers are formed. At the time when the metal layer 30 is oxidized, any ferromagnetic layer does not exist. Accordingly, the oxidation of the metal layer 30 can be preformed without giving an adverse influence on the ferromagnetic layer. In addition, the oxidation time or the pressure of charged oxygen can be relatively roughly controlled.

As stated hereinabove, after the formation of the insulating barrier layer 10, a ferromagnetic layer 31 is formed on the insulating barrier layer 10 by sputtering or the like as shown in FIG. 8. Thereafter, a resist layer 32 is formed at given portions on the ferromagnetic layer 31, for example.

As shown in FIG. 8, a given space T1 is established between the resist layers 32, 32 formed on the ferromagnetic layer 31. This space T1 is a size that is important as to whether or not a tunnel current can flow in the insulating barrier layer 10. If the space T1 is formed too widely, any tunnel current cannot flow in the insulating barrier layer at a portion thereof between the ferromagnetic layers, so that the space T1 has to be formed in a high processing accuracy.

The formation of the space T1 against the resist layers 32 can be carried out by exposure to light and development.

Next, the ferromagnetic layer 31, not covered with the resist layers 32, are removed by etching, followed by further removal of the resist layers 32. This is particularly shown in FIG. 9.

The tunneling magnetoresistive device shown in FIG. 9 has the ferromagnetic layers 31, 31 on the same plane of the insulating barrier layer 10. In the course of the etching step, care should be taken not to overetch the ferromagnetic layer 31 at a portion between the resist layers 32, 32 and also not to etch the insulating barrier layer 10 even slightly (at a dotted portion 10a in FIG. 9) so as not to degrade characteristics such as a tunnel effect.

Where the tunneling magnetoresistive device shown in FIG. 9 is used as a reproducing head mounted, for example, in a hard disk device, one ferromagnetic layer 31 is provided as a fixed magnetic layer, and the other ferromagnetic layer 31 is provided as a free magnetic layer. An antiferromagnetic layer is formed at the side of the fixed magnetic layer 31, so that the magnetization of the layer 31 is fixed in a given direction. The magnetization of the free magnetic layer is uniformly arranged in a direction crossing with the fixed magnetization of the fixed magnetic layer 31 by provision of a hard bias layer at the side of the free magnetic layer or according to an exchange bias system using an antiferromagnetic layer. Moreover, electrode layers are, respectively, provided at the fixed magnetic layer 31 and the free magnetic layer 31.

It will be noted that for the manufacture of the tunneling magnetoresistive devices of FIGS. 8 and 9, there are shown the manufacturing steps wherein the two ferromagnetic layers 31 are formed on the insulating barrier layer 10. Where three or more ferromagnetic layers 31 are formed, such manufacturing steps as shown in FIGS. 8 and 9 are employed.

As stated hereinabove, for the formation of the insulating barrier layer 10, the metal layer 31 is first formed, for example, of metallic Al, after which the metal layer is oxidized to form the insulating barrier layer 10 made of $Al_2O_3$. In the practice of the invention, the insulating barrier layer 10 may be formed of an insulating material made of an oxide of a metal and/or a semiconductor. More particularly, the insulating material is preferably formed of an oxide of at least one element selected from Al, Mg, Nb, Ni, Gd, Ge, Si and Hf.

Like $Al_2O_3$, a metal or semiconductor layer is first formed and oxidized to form the barrier layer.

In addition, if the insulating barrier layer 10 is formed, for example, of $SiO_2$, a target of $SiO_2$ is provided and the insulating barrier layer 10 made of $SiO_2$ is directly formed on a substrate.

In the case where the insulating barrier layer has to be formed thin as in a prior-art laminated, tunneling magnetoresistive device, defects such as pinholes are liable to occur even though the insulating barrier layer made of $SiO_2$ is formed by sputtering. In the practice of the invention, the insulating barrier layer 10 is formed in a relatively large thickness of H1, wherein if the insulating barrier layer 10 is formed of $SiO_2$, defects such as pinholes are unlikely to occur in the insulating barrier layer 10.

In the invention, the insulating barrier layer 10 may be formed of the following material in place of the insulating material such as $Al_2O_3$ or $SiO_2$.

(1) A perovskite-type oxide containing an Mn ion and represented by $R_{1-x}A_xMnO_3$ wherein R represents one ore more elements selected from trivalent rare earth metal ions such as $La^{3+}$, $Pr^{3+}$, $Nd^{3+}$ and the like, A represents one or more elements selected from divalent alkaline earth metal ions such as $Ca^{2+}$, $Sr^{2+}$, $Ba^{2+}$ and the like, and x is a compositional ratio.

Depending on the contents of R and A, the perovskite-type oxide of $R_{1-x}A_xMnO_3$ can be controlled in electric resistivity.

The crystal structure has the $Mn^{2+}$ ion arranged at the center of the octahedron made of oxygen ions, and the $MnO_6$ octahedral units create a three-dimensional network while sharing oxygen atoms at the respective corners. This ensures electric conduction.

On the other hand, R is arranged at so-called "interstice" of the network, and A is subjected to solid solution in the network.

Next, the specific compositions and properties and magnetic properties thereof are described below.

Where $La^{3+}$ is selected as R and $Sr^{2+}$ is selected as A, the compositional ratio of x should preferably range from 0 to 0.26. Within this range, when the above compositional ratio is appropriately selected at normal temperatures or over or when the temperature is about 80° C. or over, $La_{1-x}Sr_xMnO_3$ has a paramagnetic insulator phase and does not assume any magnetism. In addition, electric insulation is appropriately realized.

It will be noted that when the compositional ratio of x becomes higher within the above range, the electric resistance lowers more sharply. In some case, such an oxide may not be used as the insulating barrier layer 10.

The insulating barrier layer 10 should have an electric resistance sufficient to appropriately show the tunnel effect. If the electric resistance becomes too low, the tunnel effect is lost, resulting in the lowering of resistance variation rate (TMR ratio).

Moreover, it is preferred that R is $Pr^{3+}$ and A is $Ca^{2+}$. It is known that within the above-defined compositional ratio, the resultant oxide is able to provide a paramagnetic insulating layer at normal temperatures or over.

(2) Granular structural material wherein fine granules of a metal are dispersed in an insulator matrix.

When using this type of material wherein fine granules of a metal are dispersed in an insulator matrix, the electric resistance can be reduced in comparison with an insulating material such as $Al_2O_3$ or $SiO_2$. It will be noted that the insulator matrix used is $SiO_2$ or the like.

With the perovskite-type oxide of $R_{1-x}A_xMnO_3$ indicated in (1) above, proper choice of elements used as R and A and the compositional ratio of x ensures a reduced electric resistance while keeping the nature as a paramagnetic insulator. As set out above, when $LaMnO_3$ is doped with Sr to replace part of the La ion with the Sr ion and the amount of the dopant increases, the electric resistance can be lowered.

In the practice of the invention, the insulating barrier layer 10 is formed of a perovskite-type oxide of $R_{1-x}A_xMnO_3$ to reduce the electric resistance in comparison with an insulating material such as $Al_2O_3$, under which even when the space T1 between the ferromagnetic layers shown in FIGS. 1 to 6 are extended, the tunnel effect can be conveniently shown while keeping a high resistance variation rate (TMR ratio).

More particularly, it is considered that where an insulating material having a high electric resistance and ordinarily employed as an insulating barrier layer 10, e.g. $Al_2O_3$, is employed, the space T1 between the ferromagnetic layers has to be formed very narrowly in order to show an appropriate tunnel effect. According to an existing processing accuracy, limitation is placed on the reduction in size of the space T1.

In contrast, when a perovskite-type oxide of $R_{1-x}A_xMnO_3$ is used as the insulating barrier layer 10 after proper selection of R, A and the compositional ratio, the electric resistance can be lowered appropriately with easy. Thus. the tunnel effect is likely to be shown even when the space T1 between the ferromagnetic layers is extended, so that processing becomes possible within a range of existing processing accuracy.

In addition, when using the barrier material in the above (2), the electric resistance can be lowered similarly to the case (1), so that processing becomes possible within a range of existing processing accuracy.

Moreover, in the invention, it is preferred from the standpoint of improving the resistance variation rate (TMR ratio) to use a ferromagnetic metal or half metal as the ferromagnetic layers formed on the insulating barrier layer 10 as stated hereinbefore. Especially, when a half metal is used, polarizability is enabled to be near 1. Theoretically, the resistance variation rate (TMR ratio) can be increased.

The perovskite-type oxide of $R_{1-x}A_xMnO_3$ can be used as the ferromagnetic layer. As set out hereinabove, the magnetic properties of the perovskite-type oxide of $R_{1-x}A_xMnO_3$ can be changed by proper selection of elements as R and A and the compositional ratio. For instance, where $La^{3+}$ is used as R, $Sr^{2+}$ is used as A and x is 0.17 or over, $La_{1-x}Sr_xMnO_3$ becomes a ferromagnetic metal and can be used as a ferromagnetic layer.

The advantage of using the perovskite-type oxide of $R_{1-x}A_xMnO_3$ as a ferromagnetic layer is that where a perovskite-type oxide of $R_{1-x}A_xMnO_3$ serving as a paramagnetic insulator is used as the insulating barrier layer 10, the insulating barrier layer 10 and the ferromagnetic layers can be formed by epitaxial growth, thereby forming the insulating barrier layer 10 which is thin and smooth.

When using, as the insulating barrier layer 10, $SiO_2$ or the like other than the perovskite-type oxide of $R_{1-x}A_xMnO_3$, the granular structural material wherein fine granules of a metal are dispersed, or a material capable of forming an insulating barrier layer by forming a metal layer, such as $Al_2O_3$, oxidizing the metal layer, the following effects are expected.

More particularly, where a layer of a metal such as $Al_2O_3$ is formed and oxidized to form the insulating barrier layer 10, a ferromagnetic layer has to be formed on the insulating barrier layer 10 after the initial formation of the layer 10.

In this connection, however, where there is used, as the insulating barrier layer 10, $SiO_2$ or the perovskite-type oxide of $R_{1-x}A_xMnO_3$ unnecessary for oxidation, or a granular structural material wherein fine granules of a metal are dispersed in an insulator matrix, the insulating barrier layer 10 can be formed on a ferromagnetic layer after initial formation of the ferromagnetic layer.

Figure 10:
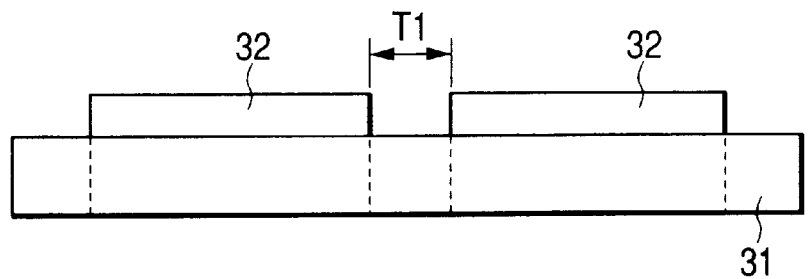
FIG. 10 is a view showing one step of a method for manufacturing another type of tunneling magnetoresistive device according to the invention.
Figure 11:
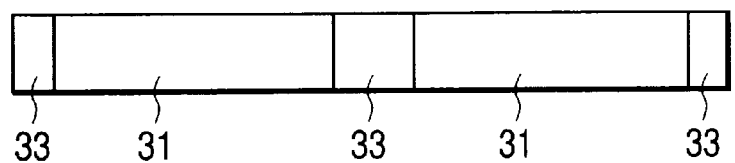
FIG. 11 is a view showing a next step of FIG. 10.
Figure 12:
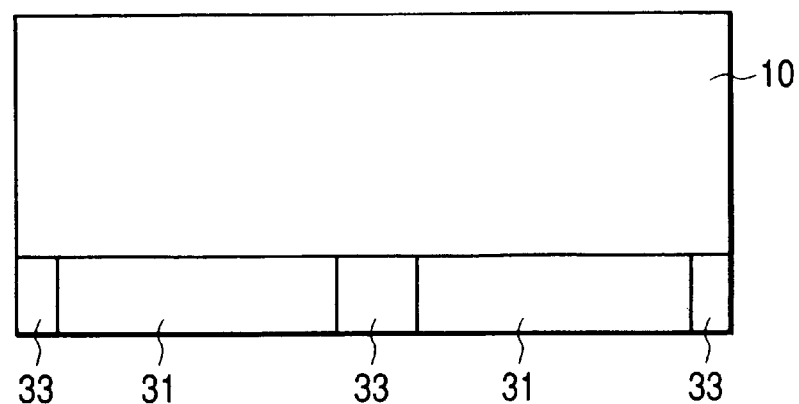
FIG. 12 is a view showing a step subsequent to FIG. 11.

The manufacturing method is shown in FIGS. 10 to 12.

As shown in FIG. 10, a ferromagnetic layer 31 is formed on a substrate, after which resists 32 having a space T1 therebetween are provided on the ferromagnetic layer 31, followed by removing the ferromagnetic layer, not covered with the resists 32, by etching.

Next, in the step shown in FIG. 11, the space T1 and other portions are buried with an insulating layer 33 as shown. Thereafter, an insulating barrier layer 10 is formed on the ferromagnetic layer 31 as shown in FIG. 12.

According to the above manufacturing method, the insulating barrier layer 10 can be made thick and is formed as being free of pinholes or the like, enabling one to manufacture a tunneling magnetoresistive device having stable characteristics.

The tunneling magnetoresistive device of the invention described in detail can be used not only as a reproducing head mounted within a hard disk device, but also a memory such as MRAM or the like.

The reproducing head using the tunneling magnetoresistive device may be of a sliding type or a floating type.

As described hereinabove, the device of the invention comprises an insulating barrier layer, and at least two ferromagnetic layers provided on or over the insulating barrier layer and arranged along the surface of insulating barrier layer to establish, between at least the two ferromagnetic layers, a space sufficient to show a tunnel effect whereby the insulating barrier layer is formed without formation of defects such as pinholes and high reproducibility is ensured.

Where $Al_2O_3$ is used as the insulating barrier layer, a metal layer is initially formed and oxidized to form the insulating barrier layer. In this case, according to the invention, the insulating barrier layer is first formed, on which ferromagnetic layers are formed. Accordingly, the insulating barrier layer can be formed thick, and thus a tunneling magnetoresistive device having good characteristics can be manufactured while not only suppressing occurrence of defects such as pinholes, but also not giving an influence of oxidation on the ferromagnetic layer upon the oxidation of the metal layer.

If three ferromagnetic layers are formed, the resistance can be reduced through a resonance tunnel effect.

When the perovskite-type oxide of $R_{1-x}A_xMnO_3$ wherein the compositional ratio and other parameters are properly selected is used as the insulating barrier layer and the ferromagnetic layers, they can be formed by epitaxial growth, thus enabling one to form a thin, smooth insulating barrier layer.

What is claimed is:

1. A tunneling magnetoresistive device, comprising: an insulating barrier layer; at least two ferromagnetic layers provided on the insulating barrier layer and arranged side by side along the surface of the insulating barrier layer; and a pair of electrode layers, wherein at least the two ferromagnetic layers are kept away from each other at a given space sufficient to show a tunnel effect so that an electric current passing from one of the electrode layers toward one of at least the two ferromagnetic layers is allowed to pass via the insulating barrier layer to the other ferromagnetic layer.

2. A tunneling magnetoresistive device according to claim 1, wherein at least one of at least the two ferromagnetic layers consists of a fixed magnetic layer whose direction of magnetization is fixed in a given direction, and at least one of at least the two ferromagnetic layers consists of a free magnetic layer.

3. A tunneling magnetoresistive device according to claim 2, wherein the free magnetic layer has magnetization uniformly arranged in a direction crossing to the direction of magnetization of the fixed magnetic layer.

4. A tunneling magnetoresistive device according to claim 3, wherein the free magnetic layer has an antiferromagnetic layer formed in contact therewith, at least, at one end portion thereof, so that magnetization of the free magnetic layer is uniformly arranged in a direction crossing to the magnetization of the fixed magnetic layer owing to an exchange anisotropic magnetic field occurring between the free magnetic layer and the antiferromagnetic layer.

5. A tunneling magnetoresistive device according to claim 4, wherein the antiferromagnetic layer is formed of an X—Mn alloy wherein X represents one or two of Pt, Pd, Ir, Rh, Ru and Os.

6. A tunneling magnetoresistive device according to claim 3, wherein the free magnetic layer has a bias layer at opposite sides or one side thereof along the direction of track width, so that magnetization of the free magnetic layer is uniformly arranged in a direction crossing to the direction of magnetization of the fixed magnetic layer owing to a bias magnetic field from the bias layer.

7. A tunneling magnetoresistive device according to claim 2, wherein at least the free magnetic layer is formed as exposed to a face opposite to a recording medium.

8. A tunneling magnetoresistive device according to claim 2, wherein an antiferromagnetic layer is formed in contact with the fixed magnetic layer, so that the magnetization of the fixed magnetic layer is fixed in the given direction owing to an exchange anisotropic magnetic field occurring between the antiferromagnetic layer and the fixed magnetic layer.

9. A tunneling magnetoresistive device according to claim 8, wherein the antiferromagnetic layer is formed of an X—Mn alloy wherein X represents one or two of Pt, Pd, Ir, Rh, Ru and Os.

10. A tunneling magnetoresistive device according to claim 2, wherein three ferromagnetic layers are provided and consist of one free magnetic layer and two fixed magnetic layers wherein the one free magnetic layer and the two fixed magnetic layers are so arranged to have a give space between adjacent layers such that an electric current from an electrode layer flows in the order of one of the two fixed magnetic layer-free magnetic layer-the other fixed magnetic layer via the insulating barrier layer.

11. A tunneling magnetoresistive device according to claim 10, wherein a pair of electrodes are, respectively, connected to the two fixed magnetic layers.

12. A tunneling magnetoresistive device according to claim 2, wherein three ferromagnetic layers are provided and consist of two free magnetic layers and one fixed magnetic layer wherein the two free magnetic layers and the one fixed magnetic layers are so arranged to have a give space between adjacent layers such that an electric current from an electrode layer flows in the order of one of the two free magnetic layer-fixed magnetic layer-the other free magnetic layer via the insulating barrier layer.

13. A tunneling magnetoresistive device according to claim 12, wherein a pair of electrodes are, respectively, connected to the two free magnetic layers.

14. A tunneling magnetoresistive device according to claim 1, wherein at least the two ferromagnetic layers are each formed of either a ferromagnetic metal or half metal.

15. A tunneling magnetoresistive device according to claim 14, wherein at least the two ferromagnetic layers are each formed of one or more of an NiFe alloy, a CoFe alloy, a Co alloy and a CoNiFe alloy.

16. A tunneling magnetoresistive device according to claim 14, wherein at least the two ferromagnetic layers are each formed of a perovskite-type oxide of the formula $R_{1-x}A_xMnO_3$, wherein R represents one or more metal ions selected from the trivalent rare earth metal ions, A represents one or more elements selected from divalent alkaline earth metal ions, and x is a compositional ratio.

17. A tunneling magnetoresistive device according to claim 16, wherein R represents $La^{3+}$, A represents $Sr^{2+}$ and x is 0.17 or over.

18. A tunneling magnetoresistive device according to claim 16, wherein R represents one or more metal ions selected from the group of trivalent rare earth metal ions comprising $La^{3+}$, $Pr^{3+}$ and $Nd^{3+}$, and A represents one or more elements selected from the group of divalent alkaline earth metal ions comprising $Ca^{2+}$, $Sr^{2+}$ and $Ba^{2+}$.

19. A tunneling magnetoresistive device according to claim 14, wherein at least the two ferromagnetic layers are each formed of a Heusler's alloy of $A_2MnX$ or AMnX wherein A represents one or more elements selected from Cu, Au, Pd, Ni and Co, and X represents one or more elements selected from Al, In, Sn, Ga, Ge, Sb and Si.

20. A tunneling magnetoresistive device according to claim 1, wherein the insulating barrier layer is formed of an insulating material of a metal oxide and/or an oxide of a semiconductor.

21. A tunneling magnetoresistive device according to claim 20, wherein the insulating material is made of an oxide of at least one element selected from Al, Mg, Nb, Ni, Gd, Ge, Si and Hf.

22. A tunneling magnetoresistive device according to claim 1, wherein the insulating barrier layer consists of a paramagnetic insulator formed of a perovskite-type oxide of the formula, $R_{1-x}A_xMnO_3$ wherein R represents one ore more metal ions selected from trivalent rare earth metal ions such as $La^{3+}$, $Pr^{3+}$, $Nd^{3+}$, A represents one or more elements selected from divalent alkaline earth metal ions such as $Ca^{2+}$, $Sr^{2+}$, $Ba^{2+}$, and x is a compositional ratio.

23. A tunneling magnetoresistive device according to claim 22, wherein R represents $La^{3+}$, A represents $Sr^{2+}$ and x is 0.26 or below.

24. A tunneling magnetoresistive device according to claim 22, wherein R represents $Pr^{3+}$, and A represents $Ca^{2+}$.

25. A tunneling magnetoresistive device according to claim 1, wherein the insulating barrier layer is formed of a granular structural material wherein fine granules of a metal are dispersed in an insulator matrix.

* * * * *

UNITED STATES PATENT AND TRADEMARK OFFICE
CERTIFICATE OF CORRECTION

PATENT NO. : 6,657,829 B2
DATED : December 2, 2003
INVENTOR(S) : Makoto Nakazawa et al.

It is certified that error appears in the above-identified patent and that said Letters Patent is hereby corrected as shown below:

Title page,
Item [75], Inventors, delete "hatanai" and substitute -- Hatanai -- in its place.
Item [56], References Cited, FOREIGN PATENT DOCUMENTS, insert -- Hei -- before "11-274597".

Column 26,
Line 32, after "one" delete "ore" and substitute -- or -- in its place.

Signed and Sealed this

Twenty-third Day of March, 2004

JON W. DUDAS
*Acting Director of the United States Patent and Trademark Office*